(12) United States Patent
Hamada

(10) Patent No.: US 6,735,354 B2
(45) Date of Patent: May 11, 2004

(54) OPTICAL DEVICE

(75) Inventor: Hidenobu Hamada, Amagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 227 days.

(21) Appl. No.: 10/116,502

(22) Filed: Apr. 3, 2002

(65) Prior Publication Data

US 2002/0146193 A1 Oct. 10, 2002

(30) Foreign Application Priority Data

Apr. 4, 2001 (JP) ........................................ 2001-105447
Jun. 8, 2001 (JP) ........................................ 2001-173666

(51) Int. Cl.[7] .............................. G02B 6/26; G02B 6/00
(52) U.S. Cl. ......................................... 385/15; 385/147
(58) Field of Search ............................ 385/10–16, 147, 385/25, 48, 125; 372/20, 32, 50, 92, 95, 105; 365/200; 359/737

(56) References Cited

U.S. PATENT DOCUMENTS

| | | | |
|---|---|---|---|
| 5,998,298 A | * 12/1999 | Fleming et al. | ............. 438/692 |
| 6,188,819 B1 | 2/2001 | Kosaka et al. | |
| 6,317,554 B1 | 11/2001 | Kosaka et al. | |
| 6,621,644 B2 | * 9/2003 | Tokushima | ................. 359/737 |
| 2001/0026659 A1 | 10/2001 | Sekine et al. | |
| 2003/0169787 A1 | * 9/2003 | Vurgaftman et al. | ........... 359/20 |
| 2003/0174961 A1 | * 9/2003 | Hamada | ....................... 385/48 |

FOREIGN PATENT DOCUMENTS

| | | |
|---|---|---|
| JP | 11-271541 A | 10/1999 |
| JP | 2000-56146 A | 2/2000 |
| JP | 2000-180789 | 6/2000 |
| JP | 2000-224109 A | 8/2000 |
| JP | 2000-232258 A | 8/2000 |
| JP | 2000-241762 | 9/2000 |
| JP | 2000-241763 | 9/2000 |
| JP | 2000-284225 | 10/2000 |
| JP | 2001-13439 A | 1/2001 |
| JP | 2001-51122 A | 2/2001 |
| JP | 2001-74954 A | 3/2001 |

* cited by examiner

*Primary Examiner*—Akm Enayet Ullah
(74) *Attorney, Agent, or Firm*—Merchant & Gould P.C.

(57) ABSTRACT

An optical device of the present invention includes a photonic crystal having a two-dimensional or three-dimensional lattice structure in which a plurality of materials with different refractive indexes are arranged periodically, wherein a two-dimensional lattice structure composed of a group of primitive lattice vectors has a lattice structure having no rotation axis with more than 3-fold.

68 Claims, 19 Drawing Sheets

US 6,735,354 B2

OPTICAL DEVICE

BACKGROUND OF THE INVENTION

1. Field of the Invention

The present invention relates to an optical device used for optical communication. In particular, the present invention relates to an optical device such as an optical separator, an optical filter, a light transmitting/receiving module for WDM (wavelength division multiplexing), an optical inductor, a bend waveguide, and an optical deflector.

2. Description of the Related Art

FIG. 17 shows an example of an optical separator utilizing a Y-separation waveguide, which is a conventional optical device. Light is incident upon a Y-separator 184 having an optical waveguide structure through an ingoing optical fiber 181. Light propagating through a Y-shaped core 186 is separated to outgoing optical fibers 182 and 183. The Y-separator 184 has a configuration in which a Y-shaped core 186 is formed on a substrate 185.

In a conventional optical device, in order to couple light in the ingoing optical fiber 181, the Y-separator 184 with an optical waveguide structure and the outgoing optical fibers 182 and 183, it is necessary to conduct the alignment of optical axes and matching in mode shapes with high precision, which requires a high skill for assembling such an optical separator. In addition, since a separation angle of the Y-separator 184 is at most about 4°, when the length of the Y-separator 184 is set to be too small, there is insufficient light separation, which makes it difficult to miniaturize the optical separator.

A conventional transmitting/receiving module for WDM will be described with reference to FIG. 18. The transmitting/receiving module for WDM is composed of an optical waveguide and a multi-layer filter.

On a substrate 191, an optical waveguide 197, a photodiode (1.3 µm) 193, a laser diode (1.55 µm) 194, a photodiode (1.55 µm) 195, and a optical fiber 192 are placed.

The optical waveguide 197 is provided with a cladding 197d, a first core 197a, a second core 197b, a third core 197c, and a WDM dielectric multilayer filter (1.3/1.55 µm) 198. The first core 197a, the second core 197b, and the third core 197c constitute a Y-shaped core, and the WDM dielectric multi-layer filter (1.3/1.55 µm) 198 is formed so as to divide these cores.

The photodiode (1.3 µm) 193 is disposed on the substrate 191 so as to be coupled to the first core 197a. Furthermore, the optical fiber 192 is fixed in a V-groove 196 formed on the substrate 191 so as to be coupled to the second core 197b. Furthermore, the laser diode (1.55 µm) 194 and the photodiode (1.55 µm) 195 are disposed on the substrate 191 so as to be coupled to the third core 197c.

When signal light of 1.3/1.55 µm WDM is incident upon the second core 197b from the optical fiber 192, the signal light is separated by the multi-layer filter 198. Then, light (1.3 µm) propagates to the first core 197a, and light (1.55 µm) propagates to the third core 197c. The light propagating to the first core 197a is received by the photodiode (1.3 µm) 193. Similarly, the light propagating to the third core 197c is received by the photodiode (1.55 µm) 195. Furthermore, signal light emitted from the laser diode (1.55 µm) 194 propagates to the third core 197c. Then, the signal light is guided to the second core 197b by the multi-layer filter 198 and sent to the optical fiber 192. An arrow 199a represents a propagation direction of the light (1.3 µm), and an arrow 199b represents a propagation direction of the light (1.55 µm).

As described above, by using the WDM transmitting/receiving module, bidirectional communication can be conducted with light (1.55 µm), and communication of receiving only can be conducted with light (1.3 µm).

However, the conventional WDM transmitting/receiving module requires the optical waveguide 197 having a Y-shaped core and the multi-layer filter 198 for separation of a wavelength. This increases the number of components, making it difficult to achieve a low cost.

In order to solve the above-mentioned problem, constituting an optical device such as an optical separator and an optical filter with a photonic crystal has drawn attention. For example, JP11(1999)-271541 discloses a wavelength separating filter using a photonic crystal with a two-dimensional triangular lattice.

In the present specification, the term "photonic crystal" refers to an artificial multi-dimensional periodic structure substantially having a period of a light wavelength.

FIGS. 19A and 19B show a configuration of the wavelength separating filter using a photonic crystal disclosed by JP11(1999)-271541. In this configuration, materials with different refractive indexes are arranged periodically, whereby strong deflection dispersion characteristics (which are not found in general optical crystal) are obtained to control wavelength deflection. Specifically, as shown in FIG. 19A, the wavelength separating filter has a configuration in which a substrate 200, which has atomic media 204 embedded in a background medium 203 in a two-dimensional triangular arrangement, is interposed between a first cladding 201 and a second cladding 202. As shown in FIG. 19B, an incident surface 208 of a light signal is tilted at a predetermined angle with respect to an incident direction 207 of the light signal, and the light signal is output from an output surface 209. The interval between the adjacent atomic media 204 is designed in accordance with the wavelength of a light signal. The thickness of the substrate 200 is designed in such a manner that a light signal is confined sufficiently in the substrate 200, and a light traveling direction does not deviate largely from the surface of the substrate 200.

The above-mentioned photonic crystal with a two-dimensional triangular lattice has a structure in which lattice vectors are matched with reciprocal lattice vectors. Even if light is incident upon a photonic crystal with such a structure in a lattice vector direction, strong deflection dispersion characteristics cannot be obtained. In order to obtain strong deflection dispersion characteristics, it is required to set a light incident surface of the photonic crystal so as to be non-vertical to a lattice vector direction or to tilt the light incident surface with respect to an incident surface vertical to the lattice vector direction, thereby allowing light to be incident upon the photonic crystal. Therefore, the incident surface 208 is tilted at a predetermined angle with respect to the incident direction 207 of a light signal in FIG. 19B.

Next, a relationship between primitive lattice vectors ($a_1$, $a_2$) and basic reciprocal lattice vectors ($b_1$, $b_2$) will be described. FIGS. 20A to 20C respectively show a relationship between a lattice and a Brillouin zone. FIG. 20A shows a tetragonal lattice, and FIG. 20B shows a triangular lattice. In each of FIGS. 20A to 20C, the upper stage shows a lattice space, whereas the lower stage shows a reciprocal lattice space. Reference numeral 211 denotes atomic media constituting a lattice, and 212 denotes a Brillouin zone. The tetragonal lattice and the triangular lattice respectively have a symmetric structure (for example, an interior angle equal to or smaller than 90° between the primitive lattice vectors is 45°, 60°, 90°, or the like). Important symmetric points of the Brillouin zone 212 in the tetragonal lattice and the triangular lattice shown in FIGS. 20A and 20B are two points (X, M) and (M, K), respectively. With such a structure, incident light to the primitive lattice vectors ($a_1$, $a_2$) does not exhibit deflection characteristics because the direction of the incident light is matched with the direction of the important symmetric point of the Brillouin zone 212.

On the other hand, in the case of an oblique lattice with low symmetry as shown in FIG. 20C, for example, when an interior angle θ between the primitive lattice vectors ($a_1$, $a_2$) is larger than 60° and smaller than 90°, the important symmetric points of the Brillouin zone become three points (H1, H2, H3). In this case, the direction of the incident light in the primitive lattice vectors ($a_1$, $a_2$) is not matched with the direction of important points of the Brillouin zone, so that deflection dispersion is exhibited. Therefore, even if light is allowed to be incident vertically upon an incident surface vertical to the primitive lattice vectors ($a_1$, $a_2$), strong deflection dispersion characteristics are exhibited.

JP11(1999)-271541 describes lattice arrangements such as a tetragonal lattice, in addition to the triangular lattice. In the case of the other lattice arrangements, an optical system is varied in a complicated manner due to the relationship between the Brillouin zone and the lattice vectors. Accordingly, in the lattice arrangements other than those with high symmetry such as a tetragonal lattice, useful deflection dispersion characteristics cannot be obtained in an optical system similar to that of a triangular lattice.

That is, in the case of forming the optical separator 184 shown in FIG. 17, and the multi-layer filter 198 constituting the WDM transmitting/receiving module shown in FIG. 18, using a photonic crystal with high symmetry, it is required to set an incident surface of the photonic crystal so as to be non-vertical to the primitive lattice vectors ($a_1$, $a_2$), or to tilt the incident surface with respect to an incident surface vertical to the primitive lattice vectors ($a_1$, $a_2$).

Therefore, not only treatment precision for producing a photonic crystal, but also higher incident angle precision of an optical system are required. This makes it difficult for an optical device to be formed of a photonic crystal with high symmetry.

SUMMARY OF THE INVENTION

Therefore, with the foregoing in mind, it is an object of the present invention to provide an optical device that can be miniaturized using a simple optical system with a small number of components without requiring a complicated optical system, a high-degree Y-shaped waveguide, and a multilayer filter.

In order to achieve the above-mentioned object, an optical device of the present invention includes a photonic crystal having a two-dimensional or three-dimensional lattice structure in which a plurality of materials with different refractive indexes are arranged periodically, wherein a two-dimensional lattice structure composed of a group of primitive lattice vectors has a lattice structure having no rotation axis of more than 3-fold. Because of this, an optical device having strong deflection dispersion characteristics can be realized.

The above-mentioned optical device may include an incident portion for allowing light to be incident in a direction of the primitive lattice vector of the photonic crystal.

Furthermore, the photonic crystal may have an incident surface vertical to the direction of the primitive lattice vector, and the incident portion may be disposed so as to allow light to be incident vertically to the incident surface.

Furthermore, in the photonic crystal, an angle equal to or smaller than 90° between at least two different primitive lattice vectors among a plurality of primitive lattice vectors may be larger than 60° and smaller than 90°.

Another optical device of the present invention includes a photonic crystal containing a first material and a plurality of columnar materials, wherein the plurality of columnar materials have a refractive index different from a refractive index of the first material and are disposed in the first material, and central axes of the plurality of columnar materials are parallel to each other, whereby a two-dimensional crystal lattice arrangement having a constant periodicity is formed, and a two-dimensional lattice structure composed of a group of primitive lattice vectors has a lattice structure having no rotation axis of more than 3-fold. According to this configuration, since a photonic crystal with low symmetry is used, an optical device having strong deflection dispersion characteristics can be realized.

Furthermore, another optical device of the present invention includes a photonic crystal containing a first material and a plurality of columnar materials, wherein the plurality of columnar materials have a refractive index different from a refractive index of the first material and are disposed in the first material, and central axes of the plurality of columnar materials are parallel to each other, whereby a two-dimensional crystal lattice arrangement having a constant periodicity is formed, and an angle equal to or smaller than 90° between two primitive lattice vectors is larger than 60° and smaller than 90°. Because of this, a plurality of columnar materials can be arranged periodically without interference, so that an optical device having strong deflection dispersion characteristics can be realized.

Furthermore, it is preferable that the photonic crystal is in a slab shape, the optical device further comprises a first cladding and a second cladding that have a refractive index lower than the refractive index of the first material of the photonic crystal, and the first cladding and the second cladding are disposed so as to be in contact with either side of the photonic crystal in the slab shape in a thickness direction. Because of this, an optical device can be realized in which light propagating through the photonic crystal does not leak.

Furthermore, it is preferable that the above-mentioned optical device includes an incident portion for allowing light to be incident in a direction of the primitive lattice vector of the photonic crystal. Because of this, an optical device can be formed easily in which light with a predetermined wavelength can be deflected at a large angle.

Furthermore, the photonic crystal may have an incident surface vertical to the direction of the primitive lattice vector, and the incident portion may be disposed so as to allow light to be incident vertically to the incident surface.

Furthermore, it is preferable that a lattice constant of a two-dimensional lattice of the photonic crystal is 0.4 to 0.6 times a wavelength of a light source to be used. Because of this, high deflection dispersion characteristics can be obtained.

Furthermore, each of the columnar materials may have a cylindrical shape, and a radius thereof may be 0.2 to 0.5 times a lattice constant.

Furthermore, a refractive index of the first material may be 1.4 to 1.6, and a refractive index of the columnar materials may be 0.9 to 1.1.

Furthermore, a difference between a refractive index of the first material and a refractive index of the columnar materials may be at least 1.0.

Furthermore, the first material may be made of a resin material, and the columnar materials may be made of air.

Furthermore, it is preferable that the above-mentioned optical device includes an ingoing optical waveguide for allowing light to be incident in a direction of a primitive lattice vector of the photonic crystal, and a first outgoing optical waveguide and a second outgoing optical waveguide for receiving an output from the photonic crystal. Because of this, a miniaturized optical filter can be formed easily at a low cost, in which light with a desired wavelength can be separated from a plurality of light beams.

Furthermore, it is preferable that the above-mentioned optical device includes: an ingoing optical fiber for allowing light to be incident in a direction of a primitive lattice vector of the photonic crystal; a first outgoing optical fiber and a second outgoing optical fiber for receiving an output from the photonic crystal; and grooves for positioning the ingoing optical fiber, the first outgoing optical fiber, and the second outgoing optical fiber. Because of this, an optical filter capable of easily conducting alignment of optical axes and matching in mode shapes can be realized even using an optical fiber.

Furthermore, an optical axis of the first outgoing optical fiber substantially may be matched with an optical axis of the ingoing optical fiber, and an optical axis of the second outgoing optical fiber may be different from an optical axis of the ingoing optical fiber.

Furthermore, a distance between the optical axis of the second outgoing optical fiber and the optical axis of the ingoing optical fiber is proportional to a length of the photonic crystal in a direction of a primitive lattice vector.

Furthermore, the above-mentioned optical device may include a substrate having the grooves, wherein the substrate is integrated with the photonic crystal.

Furthermore, the grooves may be provided in the first cladding or the second cladding.

Furthermore, it is preferable that the above-mentioned optical device includes: an optical fiber allowing light with a first wavelength and light with a second wavelength to propagate; a first light-receiving portion for receiving the light with the first wavelength; a light-emitting portion for emitting the light with the first wavelength; a second light-receiving portion for receiving the light with the second wavelength; and a substrate for fixing the optical fiber, the first light-receiving portion, the light-emitting portion, and the second light-receiving portion on a flat surface, wherein the optical fiber is disposed at one end of the photonic crystal, and an optical axis of the optical fiber is in parallel with a direction of a primitive lattice vector of the photonic crystal, the first light-receiving portion and the light-emitting portion are disposed in the same straight line as that of an optical axis of the optical fiber at the other end of the photonic crystal, and the second light-receiving portion is disposed at the other end of the photonic crystal. Because of this, a miniaturized WDM transmitting/receiving module can be realized easily at a low cost.

Furthermore, it is preferable that a lattice constant of a two-dimensional lattice of the photonic crystal is 0.4 to 0.6 times the second wavelength. Because of this, high deflection dispersion characteristics can be obtained.

Furthermore, each of the columnar materials may have a cylindrical shape, and a radius thereof may be 0.2 to 0.5 times a lattice constant.

Furthermore, a refractive index of the first material may be 1.4 to 1.6, and a refractive index of the columnar materials may be 0.9 to 1.1.

Furthermore, a difference between a refractive index of the first material and a refractive index of the columnar materials may be at least 1.0.

Furthermore, the first material may be made of a resin material, and the columnar materials may be made of air.

Furthermore, the above-mentioned optical device may include: an optical fiber allowing light with a first wavelength and light with a second wavelength to propagate; a first light-receiving portion for receiving the light with the first wavelength; a light-emitting portion for emitting the light with the second wavelength; a second light-receiving portion for receiving the light with the second wavelength; and a substrate for fixing the optical fiber, the first light-receiving portion, the light-emitting portion, and the second light-receiving portion on a flat surface, wherein the optical fiber is disposed at one end of the photonic crystal, and an optical axis of the optical fiber is in parallel with a direction of a primitive lattice vector of the photonic crystal, the first light-receiving portion is disposed in the same straight line as that of an optical axis of the optical fiber at the other end of the photonic crystal, and the second light-receiving portion and the light-emitting portion are disposed at the other end of the photonic crystal.

Furthermore, it is preferable that a lattice constant of a two-dimensional lattice of the photonic crystal is 0.4 to 0.6 times the second wavelength. Because of this, high deflection dispersion characteristics can be obtained.

Furthermore, each of the columnar materials may have a cylindrical shape, and a radius thereof may be 0.2 to 0.5 times a lattice constant.

Furthermore, a refractive index of the first material may be 1.4 to 1.6, and a refractive index of the columnar materials may be 0.9 to 1.1.

Furthermore, a difference between a refractive index of the first material and a refractive index of the columnar materials may be at least 1.0.

Furthermore, the first material may be made of a resin material, and the columnar materials may be made of air.

Furthermore, another optical device of the present invention includes a composite photonic crystal in which two kinds of photonic crystals are bonded to each other so that respective primitive lattice vectors are aligned in the same direction, wherein each of the photonic crystals contains a first material and a plurality of columnar materials, the plurality of columnar materials have a refractive index different from a refractive index of the first material and are disposed in the first material, central axes of the plurality of columnar materials are parallel to each other, whereby a two-dimensional crystal lattice arrangement having a predetermined periodicity is formed, and an angle equal to or smaller than 90° between the two primitive lattice vectors is larger than 60° and smaller than 90°. Because of this, a miniaturized optical separator can be realized at a low cost.

Furthermore, it is preferable that the composite photonic crystal is in a slab shape, the optical device further comprises a first cladding and a second cladding that have a refractive index lower than the refractive index of the first material of the two kinds of photonic crystals of the composite photonic crystal, and the first cladding and the second cladding are disposed so as to be in contact with either side of the composite photonic crystal in a thickness direction. Because of this, an optical device can be realized in which light propagating through the photonic crystal does not leak.

Furthermore, primitive lattice vectors that are not in the same direction among primitive lattice vectors of the two kinds of photonic crystals may be axisymmetric with respect to a bonding surface between the two kinds of photonic crystals.

Furthermore, it is preferable that lattice constants of both two-dimensional lattices of the two kinds of photonic crystals are 0.4 to 0.6 times a wavelength of a light source to be used. Because of this, high deflection dispersion characteristics can be obtained.

Furthermore, each of the columnar materials may have a cylindrical shape, and a radius thereof may be 0.2 to 0.5 times a lattice constant.

Furthermore, a refractive index of the first material may be 1.4 to 1.6, and a refractive index of the columnar materials may be 0.9 to 1.1.

Furthermore, a difference between a refractive index of the first material and a refractive index of the columnar materials may be at least 1.0.

Furthermore, the first material may be made of a resin material, and the columnar materials may be made of air.

Furthermore, the above-mentioned optical device may include: an ingoing optical waveguide for allowing light to be incident upon a bonding portion of the composite photonic crystal in a direction of a primitive lattice vector of the two kinds of photonic crystals; a first outgoing optical waveguide for receiving an output from one photonic crystal of the composite photonic crystal; and a second outgoing optical waveguide for receiving an output from the other photonic crystal of the composite photonic crystal, wherein the ingoing optical waveguide is disposed at one end of the composite photonic crystal, and the first outgoing optical waveguide and the second outgoing optical waveguide are disposed at the other end of the composite photonic crystal.

It is preferable that the above-mentioned optical device includes: an ingoing optical fiber for allowing light to be incident upon a bonding portion of the composite photonic crystal in a direction of a primitive lattice vector of the two kinds of photonic crystals; a first outgoing optical fiber for receiving an output from one photonic crystal of the composite photonic crystal; a second outgoing optical fiber for receiving an output from the other photonic crystal of the composite photonic crystal; and grooves for positioning the ingoing optical fiber, the first outgoing optical fiber, and the second outgoing optical fiber, wherein the ingoing optical fiber is disposed at one end of the composite photonic crystal, and the first outgoing optical fiber and the second outgoing optical fiber are disposed at the other end of the composite photonic crystal. Because of this, an optical separator capable of easily conducting alignment of optical axes and matching in mode shapes can be realized even using an optical fiber.

Furthermore, the above-mentioned optical device may include a substrate having grooves, wherein the substrate is integrated with the composite photonic crystal.

Furthermore, the grooves may be provided in the first cladding or the second cladding.

Furthermore, it is preferable that parallel composite photonic crystals including a plurality of the composite photonic crystals in parallel with each other are disposed in tandem in multiple stages. Because of this, a separator capable of separating light into a plurality of beams as well as two beams can be formed.

Furthermore, another optical device of the present invention includes: a plurality of photonic crystals each containing a first material and a plurality of columnar materials, in which the plurality of columnar materials have a refractive index different from a refractive index of the first material and are disposed in the first material, central axes of the plurality of columnar materials are parallel to each other, whereby a two-dimensional crystal lattice arrangement having a predetermined periodicity is formed, and an angle equal to or smaller than 90° between the two primitive lattice vectors is larger than 60° and smaller than 90°; an ingoing optical waveguide and an outgoing optical waveguide; and a substrate on which the plurality of photonic crystals, the ingoing optical waveguide, and the outgoing optical waveguide are disposed. The plurality of photonic crystals are bonded in tandem in a direction of a primitive vector, each of the photonic crystals is disposed so that output light deflected by an adjacent photonic crystal is in the direction of the primitive lattice vector, and the ingoing optical waveguide and the outgoing optical waveguide are bonded to each of the photonic crystals positioned at both ends. Because of this, an optical deflector that changes a traveling direction of incident light and outputs it can be formed easily.

Furthermore, it is preferable that a lattice constant of a two-dimensional lattice of the plurality of photonic crystals may be 0.4 to 0.6 times a wavelength of a light source to be used. Because of this, high deflection dispersion characteristics can be obtained.

Furthermore, each of the columnar materials may have a cylindrical shape, and a radius thereof may be 0.2 to 0.5 times a lattice constant.

Furthermore, a refractive index of the first material may be 1.4 to 1.6, and a refractive index of the columnar materials may be 0.9 to 1.1.

Furthermore, a difference between a refractive index of the first material and a refractive index of the columnar materials may be at least 1.0.

Furthermore, the first material may be made of a resin material, and the columnar materials may be made of air.

Furthermore, a size, a shape, and a position of the plurality of photonic crystals may be determined so that a propagation distance of light in each of the plurality of photonic crystals becomes equal to each other.

Furthermore, an angle formed by incident light from the ingoing optical waveguide and output light from the outgoing optical waveguide may be equal to a sum of angles at which light is deflected in the plurality of photonic crystals.

Furthermore, another optical device of the present invention includes a photonic crystal obtained by pressing a slab-shaped first material formed on a substrate with a die having columnar projections whose central axes are parallel to each other and which have a constant periodicity, in a thickness direction of the first material, and removing the die from the slab-shaped material to open columnar holes in the first material. Because of this, the photonic crystal can be formed easily.

Furthermore, the first material may be formed by coating the substrate with a material having flowability, uniformly dispersing the material to adjust a thickness thereof, and curing the material.

Furthermore, it is preferable that the columnar holes provided in the first material are filled with another material having a refractive index different from that of the first material. Because of this, the characteristics of the photonic crystal can be changed easily.

Furthermore, another optical device of the present invention includes a photonic crystal obtained by forming a mask with a predetermined periodicity on a slab-shaped first material formed on a substrate, and etching an exposed portion of the mask to open columnar holes in the first material. Because of this, the photonic crystal can be formed easily.

Furthermore, the first material may be formed by coating the substrate with a material having flowability, uniformly dispersing the material to adjust a thickness thereof, and curing the material.

Furthermore, it is preferable that the columnar holes provided in the first material are filled with another material having a refractive index different from that of the first material. Because of this, the characteristics of the photonic crystal can be changed easily.

Furthermore, another optical device of the present invention includes a photonic crystal obtained by forming a mask with a predetermined periodicity on a slab-shaped first material formed on a substrate, irradiating the first material with an ion beam to form track portions in exposed portions of the mask, and corroding the track portions by soaking the first material in an alkali solution, thereby opening columnar holes in the first material. Because of this, the photonic crystal can be formed easily.

Furthermore, the first material may be formed by coating the substrate with a material having flowability, uniformly dispersing the material to adjust a thickness thereof, and curing the material.

Furthermore, it is preferable that the columnar holes provided in the first material are filled with another material having a refractive index different from that of the first material. Because of this, the characteristics of the photonic crystal can be changed easily.

Furthermore, another optical device of the present invention includes a photonic crystal obtained by forming convex portions with a predetermined periodicity on a substrate, coating regions between the convex portions with a material having flowability, dispersing the material on the substrate to adjust a thickness of the material, curing the material, removing the convex portions to open columnar holes, and filling the columnar holes with another material having a refractive index different from that of the material having flowability. Because of this, the photonic crystal can be formed easily.

Furthermore, another optical device of the present invention having a horizontal surface vertical to a stack direction, includes a substrate in which a predetermined periodic pattern is formed in a one-dimensional or two-dimensional structure in a horizontal direction on a stack surface tilted from the horizontal surface, and a photonic crystal having a two-dimensional periodic stack structure in which at least two kinds of materials with different refractive indexes are stacked alternately on the substrate. Because of this, the photonic crystal can be formed easily.

Furthermore, it is preferable that a periodicity of the predetermined periodic pattern is 0.4 to 0.6 times a wavelength of a light source to be used. Because of this, a photonic crystal having large deflection dispersion characteristics can be formed.

Furthermore, it is preferable that a tilt of the stack surface with respect to the horizontal surface is 5° to 25°. Because of this, a photonic crystal with low symmetry can be formed easily.

Furthermore, another optical device of the present invention includes a substrate on which a predetermined periodic pattern is formed in a one-dimensional or two-dimensional structure so that an angle equal to or smaller than 90° between two primitive lattice vectors of a two-dimensional lattice is larger than 60° and smaller than 90°, and a photonic crystal having a two-dimensional or three-dimensional periodic stack structure in which at least two kinds of materials having different refractive indexes are stacked alternately on the substrate. Because of this, a photonic crystal with low symmetry can be formed easily.

Furthermore, it is preferable that a periodicity of the predetermined periodic pattern is 0.4 to 0.6 times a wavelength of a light source to be used. Because of this, a photonic crystal having large deflection dispersion characteristics can be formed.

These and other advantages of the present invention will become apparent to those skilled in the art upon reading and understanding the following detailed description with reference to the accompanying figures.

BRIEF DESCRIPTION OF THE DRAWINGS

15A is a perspective view of a substrate, and FIG. 15B is a side view thereof).

DESCRIPTION OF THE PREFERRED EMBODIMENTS

Embodiment 1

Figure 1:
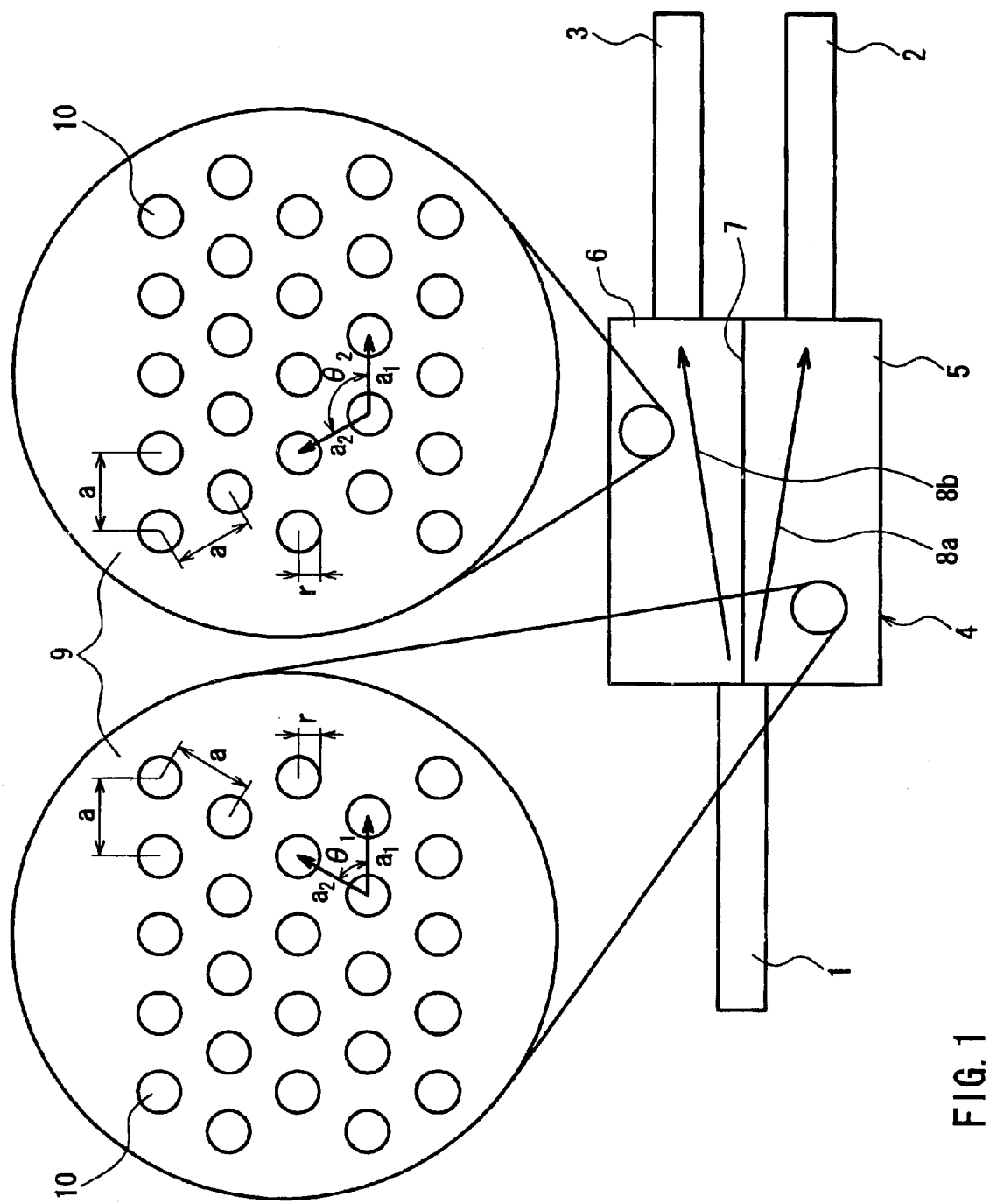
FIG. 1 is a plan view showing a configuration of an optical separator of Embodiment 1 according to the present invention.

An optical device of Embodiment 1 according to the present invention will be described with reference to FIG. 1. The optical device of Embodiment 1 is an optical separator. In this optical separator, an ingoing side optical fiber 1 is disposed so as to be coupled to one side of a composite photonic crystal 4, and outgoing optical fibers 2 and 3 are disposed so as to be coupled to the other side of the composite photonic crystal 4. The composite photonic crystal 4 has a structure in which two kinds of photonic crystals 5 and 6 are bonded to each other with a bonding surface 7.

The photonic crystals 5 and 6 have a two-dimensional structure in which columnar materials 10 are disposed periodically in a first material 9. The central axes of the respective columnar materials 10 are disposed in parallel with each other. For example, the first material 9 is made of $SiO_2$, acrylic resin (PMMA, UV acrylate resin, etc.), epoxy resin, polyimide resin, silicone resin, or carbonate resin such as polycarbonate, and the columnar materials 10 are made of air. A lattice constant "a" (distance between the columnar materials 10 preferably is 0.4 to 0.6 times the wavelength of light to be allowed to propagate. At this value, deflection dispersion characteristics are exhibited remarkably. A radius "r" of each columnar material 10 preferably is 0.2 to 0.5 times the lattice constant "a". Thus, a photonic crystal can be formed easily, merely by opening a hole in a $SiO_2$ substrate.

The photonic crystal 5 has an oblique lattice with low symmetry. It is preferable that a primitive lattice vector $a_1$ of the photonic crystal 5 is parallel to the optical axis of the ingoing optical fiber 1, and an angle $\theta_1$ between primitive lattice vectors $(a_1, a_2)$ representing the arrangement of the columnar materials 10 is larger than 60° and smaller than 90°.

A primitive lattice vector $a_1$ of the photonic crystal 6 also is parallel to the optical axis of the ingoing optical fiber 1, and has a lattice structure that is symmetric to the lattice of the photonic crystal 5 with respect to the bonding surface 7. Therefore, an angle $\theta_2$ between the primitive lattice vectors $(a_1, a_2)$ of the photonic crystal 6 is larger than 90° and smaller than 120°.

An optical axis of the ingoing optical fiber 1 is disposed at a position included in the bonding surface 7, and the respective outgoing optical fibers 2 and 3 are disposed so as to be coupled to output light at predetermined positions of the respective photonic crystals 5 and 6.

A bonding surface between the composite photonic crystal 4 and the ingoing optical fiber 1 is vertical to the primitive lattice vector $a_1$ of the photonic crystals 5 and 6.

When light is incident upon the composite photonic crystal 4 from the ingoing optical fiber 1, halves of an output thereof are input to the photonic crystals 5 and 6. In the case where light with a predetermined wavelength is incident in a primitive lattice vector direction of an oblique lattice as in the photonic crystals 5 and 6, the light is deflected. The deflection angle and wavelength of light to be deflected can be controlled by varying the kinds of the first material 9 and the columnar materials 10, the lattice constant "a", the radius "r" of the columnar materials 10, the angle $\theta_1$ between the primitive lattice vectors $(a_1, a_2)$, and the like.

For example, the following is confirmed. By allowing light to be incident in the direction of the primitive lattice vector $a_1$ of a photonic crystal with a lattice structure having low symmetry in which the angle $\theta_1$ between the primitive lattice vectors $(a_1, a_2)$ is larger than 60° and smaller than 90°, the incident light can be deflected.

In Embodiment 1, the conditions are set in such a manner that incident light from the ingoing optical fiber 1 is deflected in a deflection direction 8a in the photonic crystal 5. The photonic crystal 6 has a lattice structure that is symmetric to the lattice of the photonic crystal 5 with respect to the bonding surface 7, so that the incident light is deflected in a deflection direction 8b symmetric to the deflection direction 8a with respect to the bonding surface 7. If the outgoing optical fibers 2 and 3 are bonded at positions where light that travels while being deflected reaches an outgoing end of the composite photonic crystal 4, separated light can be guided to the outgoing optical fibers 2 and 3.

By disposing the optical axis of the ingoing optical fiber 1 at a position that is closer to either of the photonic crystals 5 and 6 and shifted from the bonding surface 7, separated outputs to the photonic crystals 5 and 6 are varied, whereby outputs of light to the outgoing optical fibers 2 and 3 can be controlled. For example, when the optical axis of the ingoing optical fiber 1 is shifted to the photonic crystal 5, an output of light to the outgoing optical fiber 2 becomes higher than that to the outgoing optical fiber 3.

Figure 2:
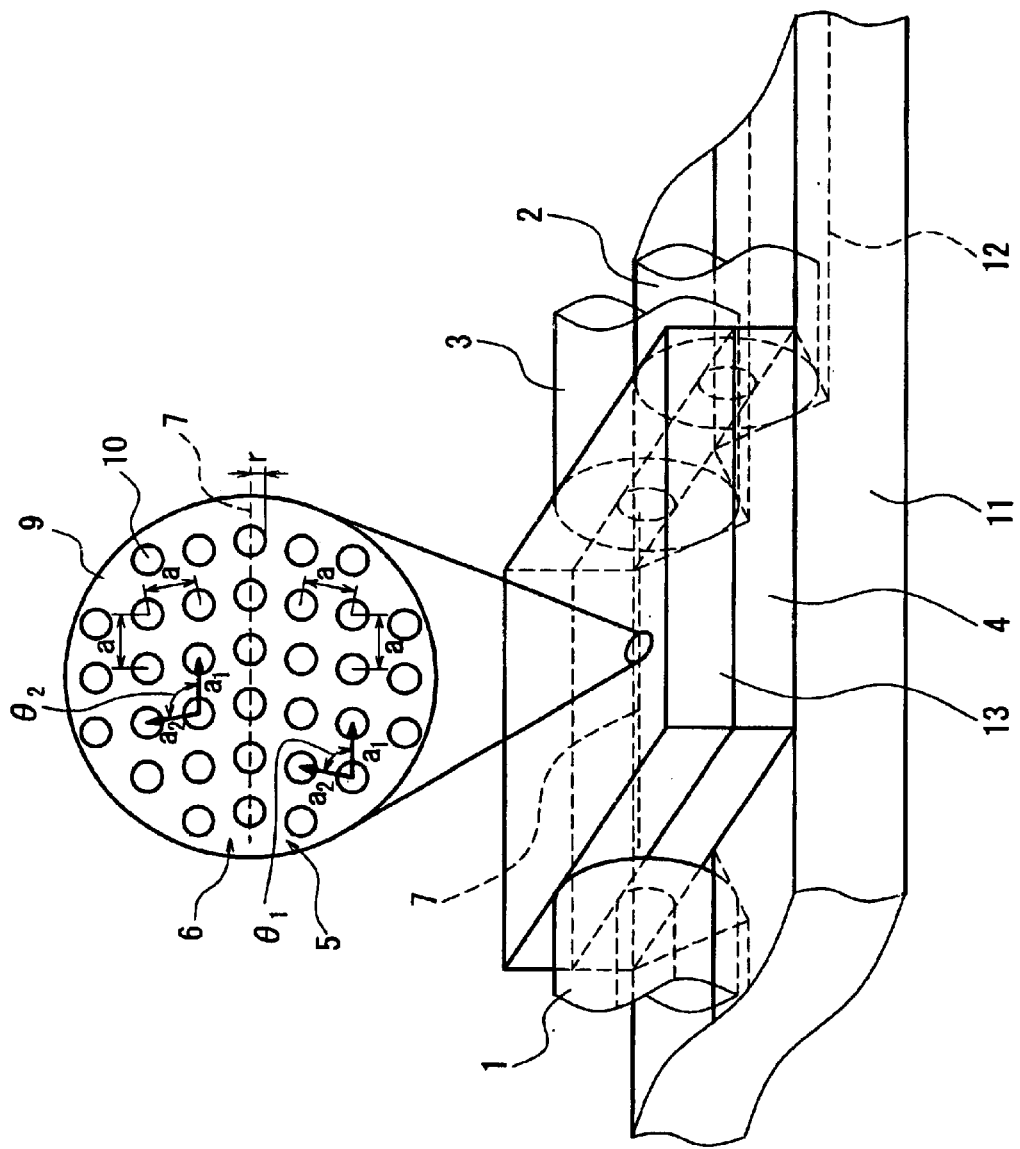
FIG. 2 is a perspective view showing a configuration of the optical separator of Embodiment 1 according to the present invention.

Specifically, the optical device of Embodiment 1 may have a slab waveguide structure shown in FIG. 2. A slab-shaped composite photonic crystal 4 and a slab waveguide cladding 13 are stacked on a substrate 11 having three V-grooves 12. In the V-grooves 12, an ingoing optical fiber 1, and outgoing optical fibers 2 and 3 are fixed. Due to the presence of the V-grooves 12, it is easy to align the optical axes of the optical fibers 1, 2, and 3.

The substrate 11 also functions as a cladding. By interposing the composite photonic crystal 4 between the substrate 11 and the slab waveguide cladding 13, air holes (columnar materials 10) are closed, whereby light is prevented from leaking from the columnar materials 10. It is desirable that the refractive indexes of the substrate 11 and the slab waveguide cladding 13 are at least lower than that of the first material 9, and equal to or lower than that of the columnar materials 10. In addition to light confinement in this manner, it also may be possible that a multi-layer film is formed in a direction vertical to the substrate 11 in place of a cladding, and light is confined using Bragg reflection.

Figure 3:
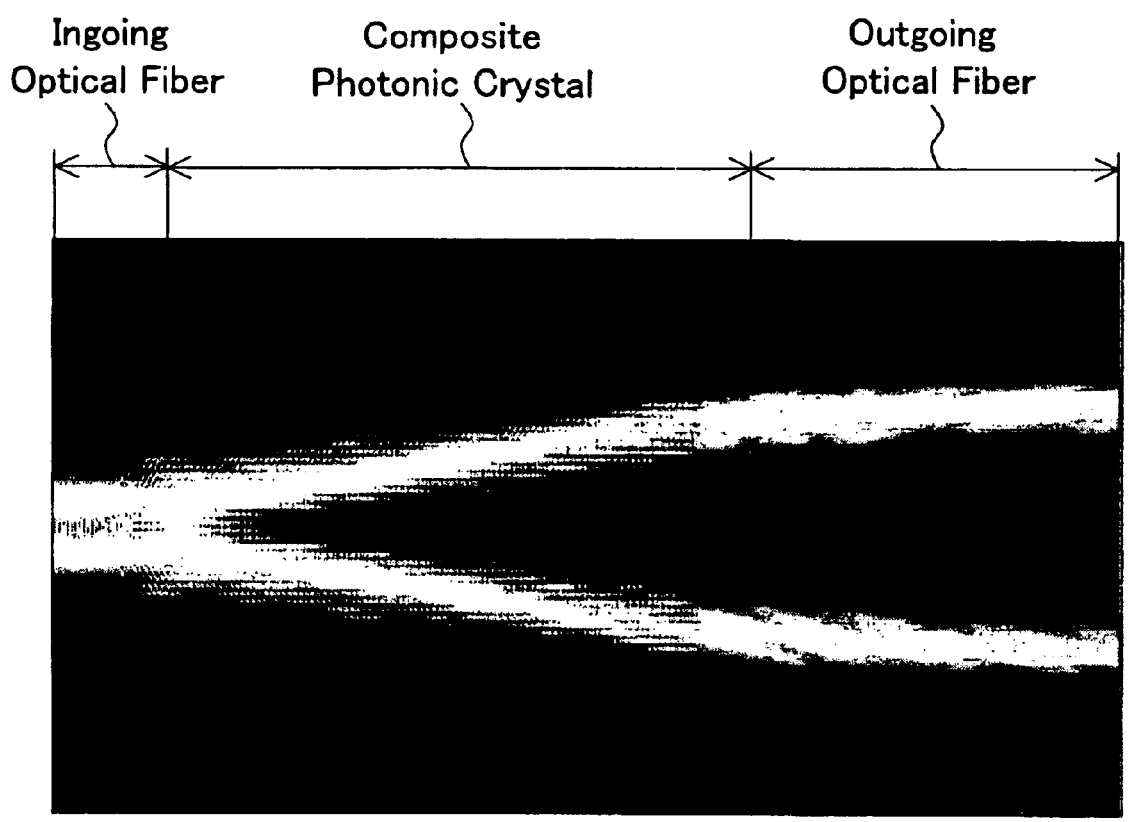
FIG. 3 shows measurement results of the optical separator of Embodiment 1 according to the present invention.

FIG. 3 shows measurement results of separated light by using the optical device of FIG. 2. FIG. 3 shows a light output, in which light traveling straight from the ingoing optical fiber on the left side is separated in the composite photonic crystal, and travels straight again in each outgoing optical fiber on the right side. This corresponds to the case where the refractive index of the first material 9 is 1.5, the refractive index of the columnar materials 10 is 1.0 in air holes, and the angle $\theta_1$ between the primitive lattice vectors ($a_1$, $a_2$) of the photonic crystal 5 is 80°. In this case, the separation angle between separated light beams is 12°.

It is preferable that the refractive index of the first material 9 is 1.4 to 1.6, and the refractive index of the columnar materials 10 is 0.9 to 1.1. It may also be possible that the difference in relative refractive index between the first material 9 and the columnar materials 10 is 1.0 or more. For example, the first material 9 may be made of a high refractive material such as Si, GaAs, and $Ti_2O_5$, and the columnar material 10 is made of a low refractive material.

Furthermore, it is not required to interpose the photonic crystal 5 between the substrate 11 and the slab waveguide cladding 13. Both the substrate 11 and the slab waveguide cladding 13 may be replaced by air or either one of them may be replaced by air.

Furthermore, in order to satisfy single-mode conditions of the slab waveguide structure, it is required to adjust the refractive indexes of the slab waveguide cladding 13 and the substrate 11, and the thickness of the composite photonic crystal 4 in accordance with the refractive index of the first material 9. For example, when the difference in refractive index between the first material 9 and the slab waveguide cladding 13 or the substrate 11 is 10% or less, the thickness of the composite photonic crystal 4 may be several μm to 10 μm. When the difference in refractive index is 10% or more, the thickness becomes equal to or smaller than several μm. When the thickness is equal to or smaller than several μm, the coupling with optical fibers becomes poor, which is not suitable.

As described above, in Embodiment 1, since a photonic crystal is used, the optical device can be formed easily. Furthermore, light is allowed to be incident in the direction of the primitive lattice vector $a_1$, so that it only is necessary to form a photonic crystal having an incident surface vertical to the direction of the primitive lattice vector $a_1$, which is conducted easily. Furthermore, alignment of optical axes and matching in mode shape can be conducted easily. Furthermore, an optical separator having a large separation angle can be realized, and even with a miniaturized configuration, light can be separated sufficiently.

Embodiment 2

An optical device of Embodiment 2 according to the present invention will be described with reference to FIG. 4. In the optical device of Embodiment 2, the composite photonic crystal in Embodiment 1 is used in multi-stages, and the separation number of light is set to be four.

Figure 4:
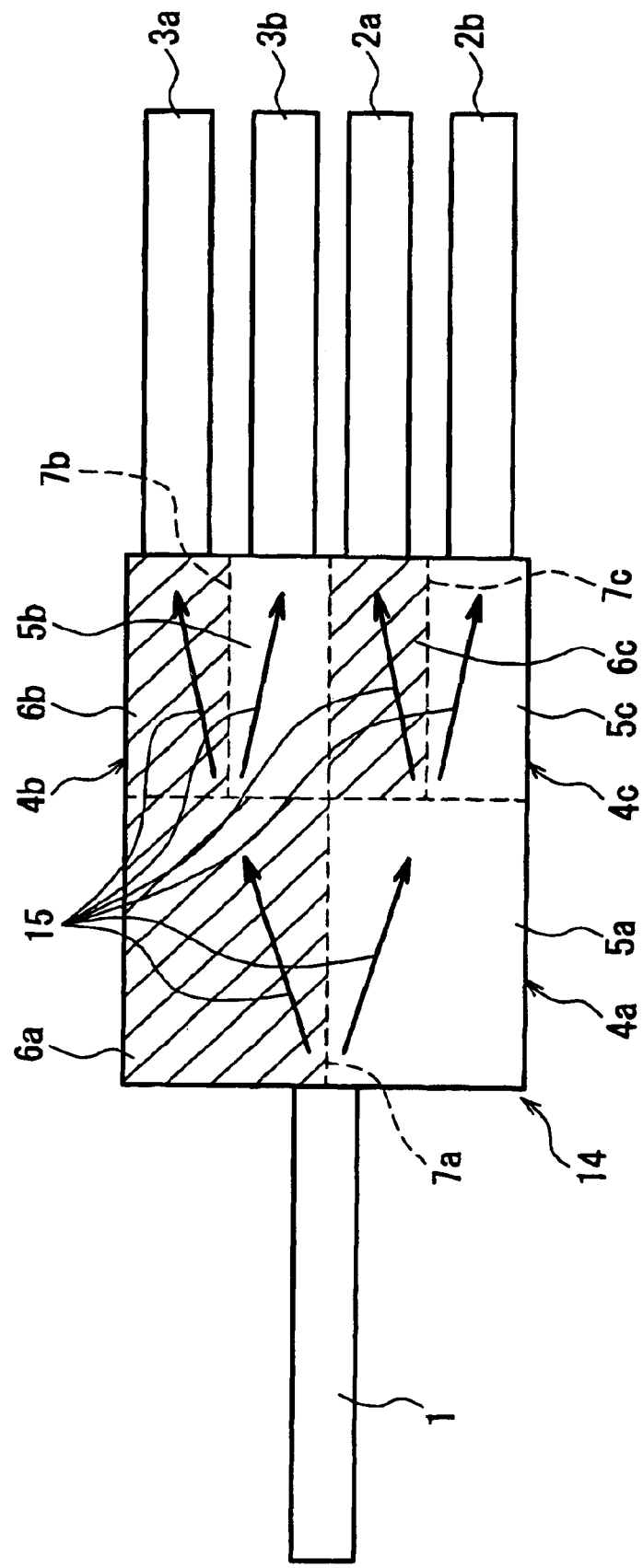
FIG. 4 is a plan view showing a configuration of an optical separator of Embodiment 2 according to the present invention.

FIG. 4 shows a configuration of the optical device of Embodiment 2 according to the present invention. The composite photonic crystal 14 is composed of composite photonic crystals 4a, 4b, and 4c. An ingoing optical fiber 1 is bonded to one end of the composite photonic crystal 4a. One end of the composite photonic crystal 4b is bonded to a half of the other end of the composite photonic crystal 4a, and the composite photonic crystal 4c is bonded to the remaining half thereof. Outgoing optical fibers 3a, 3b, 2a, and 2b are bonded at predetermined positions of the other ends of the composite photonic crystals 4b and 4c.

The respective composite photonic crystals 4a, 4b, and 4b have a configuration similar to that of the composite photonic crystal 4 in FIG. 1. More specifically, the composite photonic crystal 4a has a configuration in which photonic crystals 5a and 6a having two kinds of lattice structures symmetric with each other are bonded at a bonding surface 7a. The optical axis of the ingoing optical fiber 1 is disposed at a position included in the bonding surface 7a of the composite photonic crystal 4a, whereby light from the incident side light fiber 1 is separated.

The composite photonic crystal 4b has a configuration in which photonic crystals 5b and 6b having two kinds of lattice structures symmetric with each other are bonded at a bonding surface 7b. The composite photonic crystal 4b is designed so that light separated by the composite photonic crystal 4a is incident upon the vicinity of the bonding surface 7b, and separates the incident light so as to guide it to the outgoing optical fibers 3a and 3b.

The composite photonic crystal 4c has a configuration in which photonic crystals 5c and 6c having two kinds of lattice structures symmetric with each other are bonded at a bonding surface 7c. The composite photonic crystal 4c is designed so that light separated by the composite photonic crystal 4a is incident upon the vicinity of the bonding surface 7c, and separates the incident light so as to guide it to the outgoing optical fibers 2a and 2b.

The respective outgoing optical fibers 3a, 3b, 2a, and 2b are disposed at positions where the light separated by the respective composite photonic crystals 4b and 4c are output, and allow the output light to propagate. More specifically, the light incident from the ingoing optical fiber 1 is separated into four as represented by light traveling directions 15.

In the optical device of Embodiment 2, the composite photonic crystals 14 are interposed between upper and lower claddings to form a slab waveguide structure, whereby light leakage can be eliminated. Furthermore, by increasing the number of composite photonic crystals, a further multi-optical separator can be produced.

As described above, in the optical device of Embodiment 2, a four-separator can be formed easily.

Embodiment 3

An optical device of Embodiment 3 according to the present invention will be described with reference to FIG. 5. The optical device of Embodiment 3 is a beam inductor.

Figure 5:
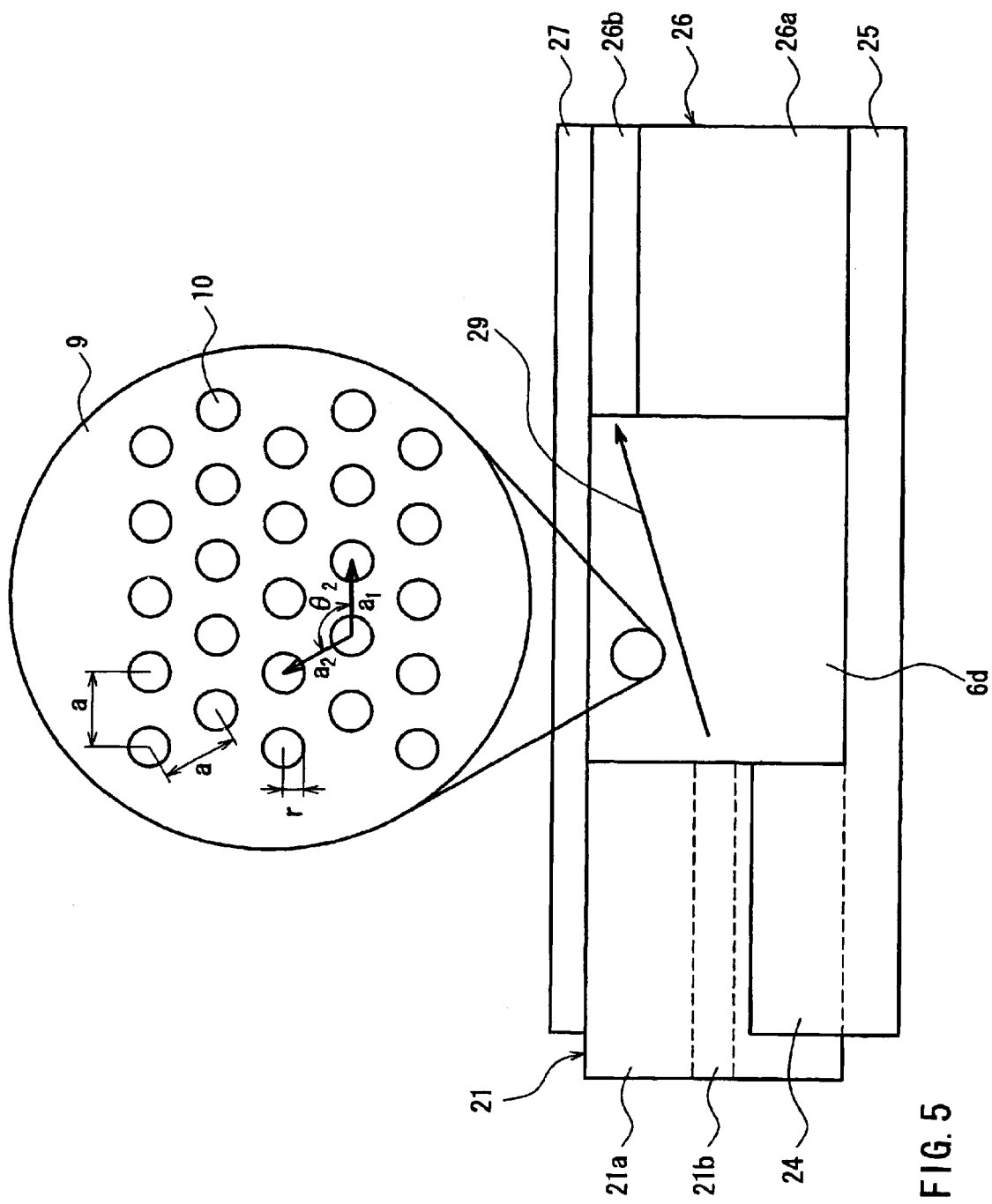
FIG. 5 is a side view showing a configuration of a beam inductor of Embodiment 3 according to the present invention.

FIG. 5 is a side view of the optical device of Embodiment 3. An optical fiber 21 composed of a cladding 21a and a core 21b, a slab-shaped photonic crystal 6d having a lattice structure similar to that of the photonic crystal 6 of Embodiment 1, and an optical waveguide 26 with a core 26b embedded in a waveguide substrate 26a are disposed on a substrate 25 having a V-groove 24. A cover 27 that also functions as a cladding of the optical waveguide 26 is disposed above the optical fiber 21, the photonic crystal 6d, and the optical waveguide 26. The cladding 21a of the optical fiber 21 and the core 26b of the optical waveguide 26 are fixed to the cover 27 in surface alignment.

The photonic crystal 6d is bonded to the optical fiber 21 and the optical waveguide 26 at the respective ends, and the optical fiber 21 is fixed in the V-groove 24. The optical axes of the core 21b of the optical fiber 21 and the core 26b of the optical waveguide 26 are shifted from each other.

The photonic crystal 6d has a crystal structure (i.e., a two-dimensional structure) similar to that of the photonic crystal 6 in Embodiment 1, in which columnar materials 10 are arranged periodically in the first material 9. The central axes of the respective columnar materials 10 are disposed parallel to each other. For example, the first material 9 is made of $SiO_2$, acrylic resin (EMMA, UV acrylate resin, etc.), epoxy resin, polyimide resin, silicone resin, or carbonate resin such as polycarbonate, and the columnar materials 10 are made of air. It is preferable that a lattice constant "a" (distance between the columnar materials) of the columnar materials 10 preferably is 0.4 to 0.6 times the wavelength of light to be allowed to propagate, and a radius "r" of the columnar materials 10 is 0.2 to 0.5 times the lattice constant "a". Furthermore, the photonic crystal 6d has an oblique lattice structure with low symmetry. A primitive lattice vector $a_1$ is parallel to the optical axis of the core 21b of the optical fiber 21, and an angle $\theta_2$ between primitive lattice vectors ($a_1$, $a_2$) representing the arrangement of the columnar materials 10 is larger than 90° and smaller than 120°. Furthermore, the bonding surface of the photonic crystal 6d and the optical fiber 21 is vertical to the primitive lattice vector $a_1$.

Light with a predetermined wavelength parallel to the primitive lattice vector $a_1$, incident upon the photonic crystal 6d from the optical fiber 21 is deflected at a predetermined angle as represented by a light traveling direction 29. The wavelength and deflection angle of light to be deflected are varied depending upon the crystal structure of the photonic crystal 6d; therefore, desired characteristics can be obtained by adjusting the crystal structure.

The core 26b of the optical waveguide 26 is disposed at a position where light deflected by the photonic crystal 6d is output. Because of this, the light incident from the optical fiber 21 is incident upon the core 26b of the optical waveguide 26 with an optical axis different from that of the core 21b.

As described above, in the optical device of Embodiment 3, a beam inductor can be formed easily with a large refractive index, so that miniaturization thereof also is possible. For example, in the case of a single-mode fiber, an axis shift of about 60 μm occurs. However, if a photonic crystal that is deflected by 6° is used, light can be coupled in a beam inductor with a length of about 570 μm.

Embodiment 4

An optical device of Embodiment 4 according to the present invention will be described with reference to FIG. 6. The optical device of Embodiment 4 is an optical filter.

Figure 6:
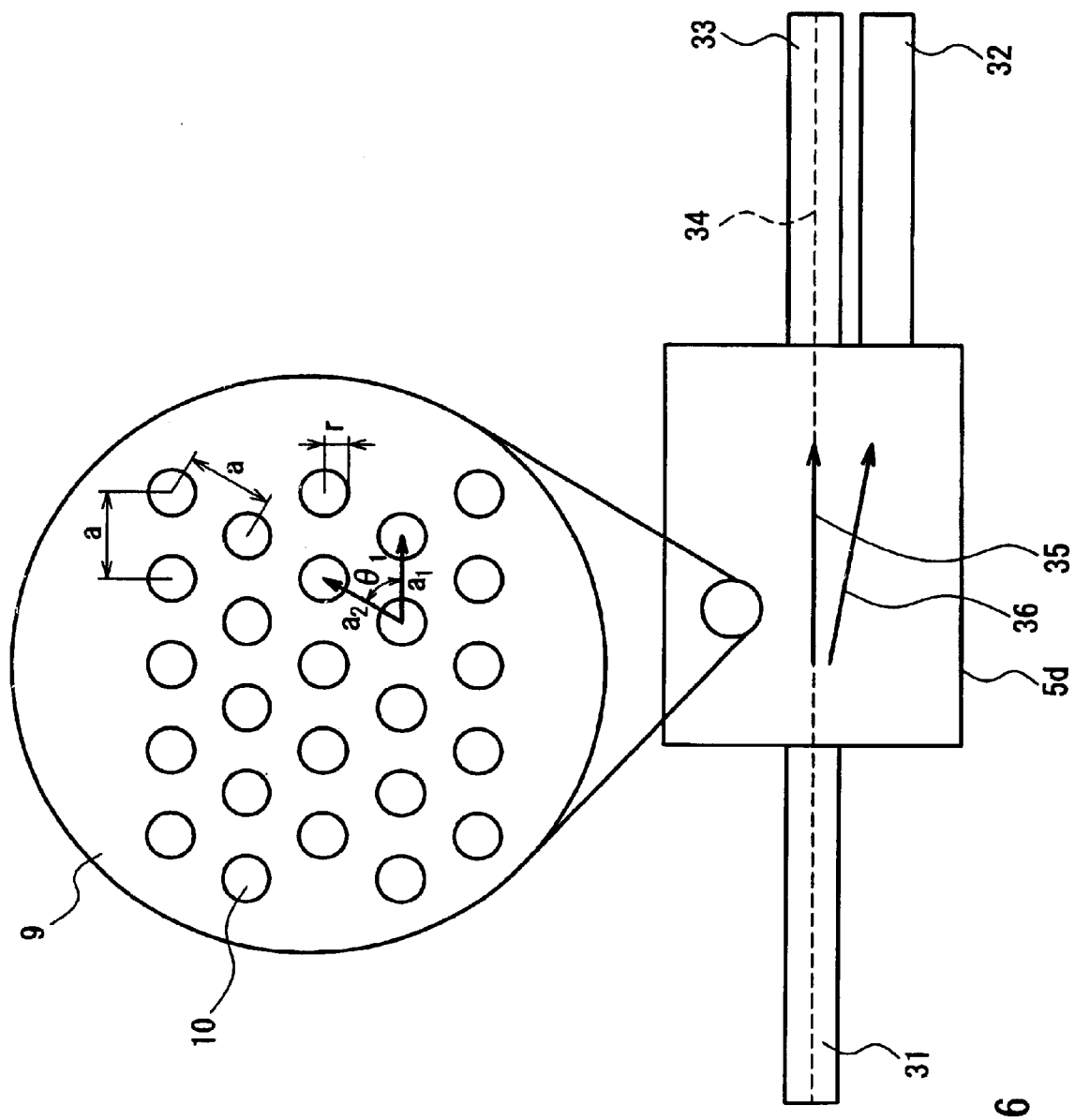
FIG. 6 is a plan view showing a configuration of an optical filter of Embodiment 4 according to the present invention.

As shown in FIG. 6, an ingoing optical fiber 31 is bonded to one end of a photonic crystal 5d, and outgoing optical fibers 32 and 33 are bonded to the other end of the photonic crystal 5d. The ingoing optical fiber 31 and the outgoing optical fiber 33 have the same optical axis 34, and the optical axis of the outgoing optical fiber 32 is shifted from the optical axis 34.

The photonic crystal 5d has a lattice structure similar to that of the photonic crystal 5 of Embodiment 1. More specifically, the photonic crystal 5d has a two-dimensional structure in which the columnar materials 10 are arranged periodically in the first material 9. The central axes of the respective columnar materials 10 are parallel to each other. For example, the first material 9 is made of $SiO_2$, acrylic resin (PMMA, UV acrylate resin, etc.), epoxy resin, polyimide resin, silicone resin, or carbonate resin such as polycarbonate, and the columnar materials 10 are made of air. It is preferable that a lattice constant "a" (distance between the columnar materials) of the columnar materials 10 preferably is 0.4 to 0.6 times the wavelength of light to be allowed to propagate, and a radius "r" of the columnar materials 10 is 0.2 to 0.5 times the lattice constant "a". Furthermore, the photonic crystal 5d has an oblique lattice structure with low symmetry. A primitive lattice vector $a_1$ is parallel to the optical axis of the ingoing optical fiber 31, and an angle $\theta_1$ between primitive lattice vectors ($a_1$, $a_2$) representing the arrangement of the columnar materials 10 is larger than 60° and smaller than 90°.

The wavelength and deflection angle of light to be deflected among light parallel to the primitive lattice vector $a_1$, incident upon the photonic crystal 5d from the optical fiber 31, are varied depending upon the crystal structure of the photonic crystal 5d. Therefore, by adjusting the crystal structure, a photonic crystal having desired characteristics is formed. The photonic crystal 5d is designed so that light (selected light) with a wavelength of $f_k$ is deflected, and light (non-selected light) with the other wavelengths is allowed to travel straight.

When a plurality of light beams containing light (wavelength: $f_k$) are incident upon the photonic crystal 5d from the ingoing optical fiber 31, the light (wavelength: $f_k$) is deflected as represented by a traveling direction 36 and guided to the outgoing optical fiber 32. Furthermore, the light with the wavelengths other than the wavelength $f_k$ travels straight as represented by a traveling direction 35 and is guided to the outgoing optical fiber 33. With such a configuration, an optical filter can be formed in which light having a desired wavelength $f_k$ is taken out. The outgoing optical fiber 32 is disposed at a position where selected light is deflected and output from the photonic crystal 5d.

Furthermore, the outgoing optical fiber 32 is disposed so that its optical axis is placed at a position away from the optical axis of the outgoing optical fiber 33 by a distance proportional to a lateral width of the photonic crystal 5d. More specifically, if the photonic crystal 5d is enlarged, a distance between the respective outgoing optical fibers 32 and 33 also is increased.

Figure 7:
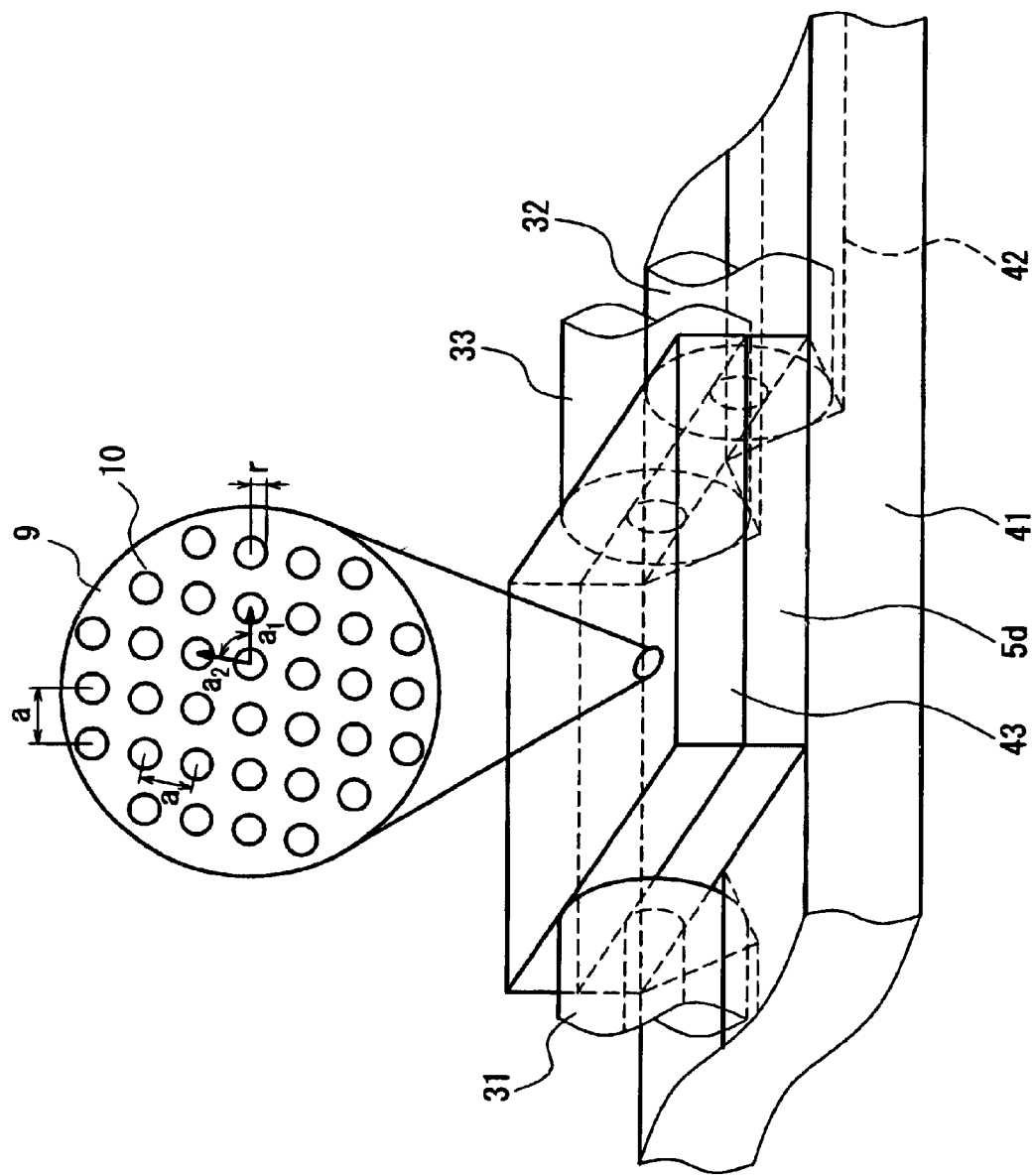
FIG. 7 is a perspective view showing a configuration of an optical filter of Embodiment 4 according to the present invention.

Specifically, the optical device of Embodiment 4 may have a slab waveguide structure shown in FIG. 7. A slab-shaped photonic crystal 5d and a slab waveguide cladding 43 are stacked on a substrate 41 having three V-grooves 42. The ingoing optical fiber 31, and the outgoing optical fibers 32 and 33 are fixed in the V-grooves 42. Because of the presence of the V-grooves 42, alignment becomes easy.

The substrate 41 also functions as a cladding. By interposing the composite photonic crystal 5d between the substrate 41 and the slab waveguide cladding 43, air holes (columnar materials 10) are closed, whereby light is prevented from leaking from the columnar materials 10. The refractive indexes of the substrate 41 and the slab waveguide cladding 43 are at least lower than that of the first material 9, and equal to or lower than that of the columnar materials. In addition to light confinement in this manner, it also may be possible that a multi-layer film is formed in a direction vertical to the substrate 41 in place of a cladding, and light is confined using Bragg reflection.

Figure 8A:
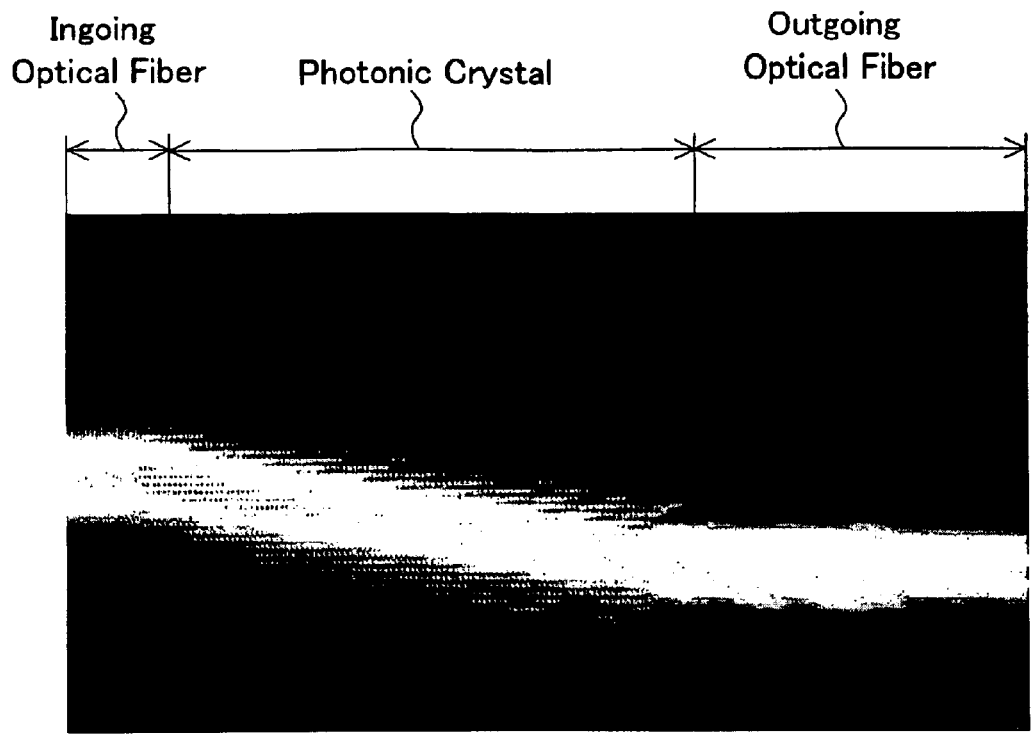
FIGS. 8A and 8B show measurement results for the optical filter of Embodiment 4 according to the present invention (FIG. 8A is an output diagram of selected light and FIG. 8B is an output diagram of non-selected light).
Figure 8B:
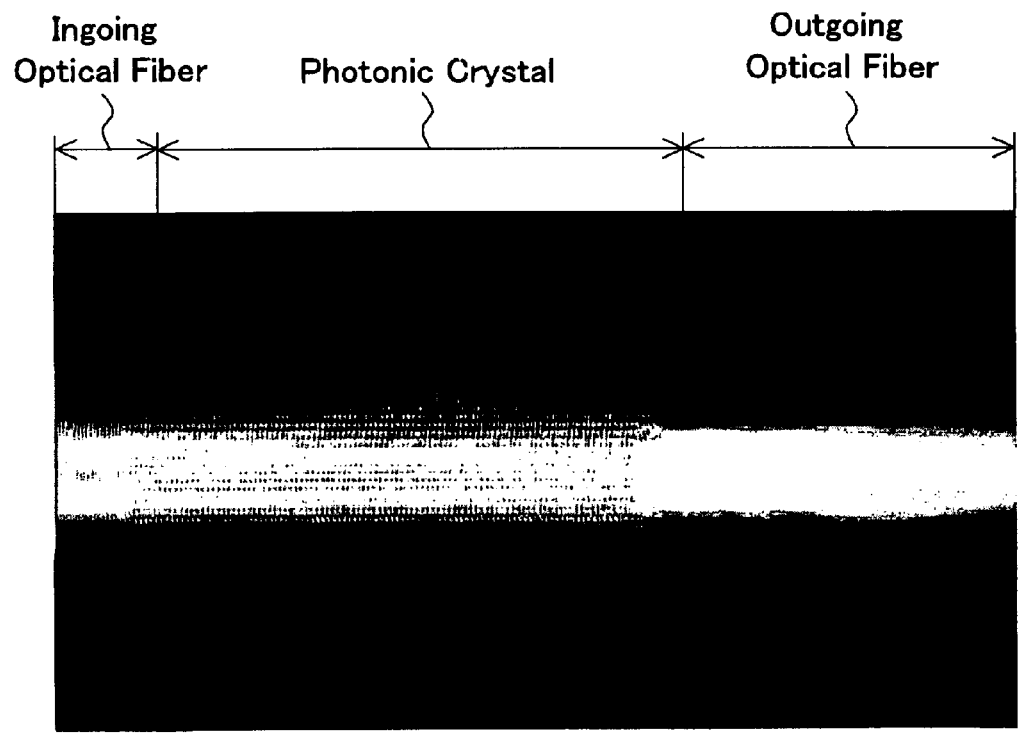

FIGS. 8A and 8B show measurement results obtained by using the optical device of FIG. 7. FIG. 8A shows a light output in the case where selected light is incident, in which selected light traveling straight from the ingoing optical fiber on the left side is deflected by 6° in the photonic crystal, and travels straight again in the outgoing optical fiber on the right side. FIG. 8B shows a light output in the case where non-selected light is incident, in which the non-selected light travels straight in the ingoing optical fiber, the photonic crystal, and the outgoing optical fiber. This corresponds to the case where the refractive index of the first material 9 is 1.5, the refractive index of the columnar materials 10 is 1.0 in air holes, and the angle $\theta_1$ between the primitive lattice vectors ($a_1$, $a_2$) of the photonic crystal 5d is 80°.

It is preferable that the refractive index of the first material 9 is 1.4 to 1.6, and the refractive index of the columnar materials 10 is 0.9 to 1.1. It may also be possible that the difference in relative refractive index between the first material 9 and the columnar materials 10 is 1.0 or more. For example, the first material 9 may be made of a high refractive material such as Si, GaAs, and $Ti_2O_5$, and the columnar material 10 is made of a low refractive material such as $SiO_2$.

Furthermore, it is not required to interpose the photonic crystal 5 between the substrate 41 and the slab waveguide cladding 43. Both the substrate 41 and the slab waveguide cladding 43 may be replaced by air or either one of them may be replaced by air.

Furthermore, in order to satisfy single-mode conditions of the slab waveguide structure, it is required to adjust the refractive indexes of the slab waveguide cladding 43 and the substrate 41, and the thickness of the photonic crystal 5d in accordance with the refractive index of the first material 9. For example, when the difference in refractive index between the first material 9 and the slab waveguide cladding 43 or the substrate 41 is 10% or less, the thickness of the photonic crystal 5d may be several 10 μm to 10 μm. When the difference in refractive index is 10% or more, the thickness becomes equal to or smaller than several μm. When the thickness is equal to or smaller than several μm, the coupling with optical fibers becomes poor, which is not suitable.

As described above, in Embodiment 4, since the photonic crystal is used, the optical device can be formed easily.

Embodiment 5

Figure 9:
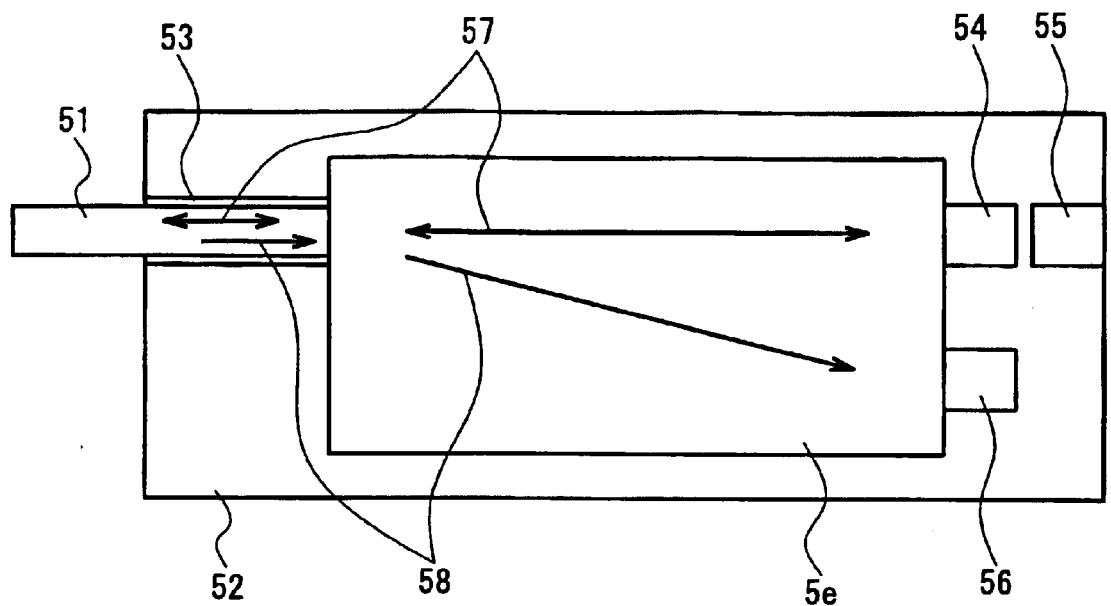
FIG. 9 is a plan view showing a configuration of a WDM transmitting/receiving module of Embodiment 5 according to the present invention.

An optical device of Embodiment 5 according to the present invention will be described with reference to FIG. 9. As shown in FIG. 9, an ingoing optical fiber 51 for transmitting two wavelengths (1.3 μm, 1.55 μm) of WDM fixed in a V-groove 53, a slab-shaped photonic crystal 5e, a laser diode (1.55 μm) 54, a photodiode (1.55 μm) 55, and a photodiode (1.3 μm) 56 are provided on a substrate 52 having the V-groove 53.

The photonic crystal 5e has a lattice structure similar to that of the photonic crystal 5 of Embodiment 1. That is, the photonic crystal 5e has a two-dimensional structure, in which columnar materials are disposed periodically in a first material. The central axes of the respective columnar materials are disposed parallel to each other. For example, the first material is made of $SiO_2$, acrylic resin (PMMA, UV acrylate resin, etc.), epoxy resin, polyimide resin, silicone resin, or carbonate resin such as polycarbonate, and the columnar materials are made of air. A lattice constant "a" (distance between the columnar materials) of the columnar materials preferably is 0.4 to 0.6 times the wavelength of light to be allowed to propagate. Aradius "r" of each columnar material preferably is 0.2 to 0.5 times the lattice constant "a". Furthermore, the photonic crystal 5e has an oblique lattice structure with low symmetry. A primitive lattice vector $a_1$ is parallel to the optical axis of the ingoing optical fiber 51, and an angle $\theta_1$ between the primitive lattice vectors ($a_1$, $a_2$) representing the arrangement of the columnar materials is larger than 60° and smaller than 90°. Furthermore, the crystal structure of the photonic crystal 5e is adjusted. When light is incident in the direction of the primitive lattice vector $a_1$ of the photonic crystal 5e, irrespective of an incident position of the light, only light with a wavelength of 1.3 μm is refracted largely, and light with a wavelength of 1.55 μm travels straight without being refracted.

Although not shown, a slab waveguide cladding with a refractive index lower than that of the first material is disposed on the upper surface of the photonic crystal 5e. The laser diode (1.55 μm) 54 and the photodiode (1.55 μm) 55 are disposed so as to be opposed to the ingoing optical fiber 51 with respect to the photonic crystal 5e on the optical axis of the ingoing optical fiber 51. The photodiode (1.3 μm) 56 is disposed at a position shifted from the optical axis of the ingoing optical fiber 51, whereby light deflected in the photonic crystal 5e is disposed at a position away from the optical axis of the optical fiber 51 by a distance proportional to the lateral length of the photonic crystal 5e.

When signal light of 1.3/1.55 μm WDM is incident upon the photonic crystal 5e from the ingoing optical fiber 51, the light with a wavelength of 1.3 μm is deflected and received by a photodiode (1.3 μm) 56. The light with a wavelength of 1.55 μm travels straight to be received by the photodiode (1.55 μm) 55. The signal light emitted from the laser diode (1.55 μm) 54 travels straight through the photonic crystal 5e, and is sent to the ingoing optical fiber 51. An arrow 58 represents a propagation direction of light (1.3 μm), and an arrow 57 represents a propagation direction of light (1.55 μm).

In the above-mentioned manner, bidirectional communication can be conducted with light having a wavelength of 1.55 μm, and only receiving communication can be conducted with light having a wavelength of 1.3 μm, using the optical device of Embodiment 5.

As described above, in the optical device of Embodiment 5, a Y-shaped waveguide and a multi-layer filter for separation of wavelength are not required. Thus, a WDM transmitting/receiving module with fewer components can be realized with a simple configuration.

Embodiment 6

Figure 10:
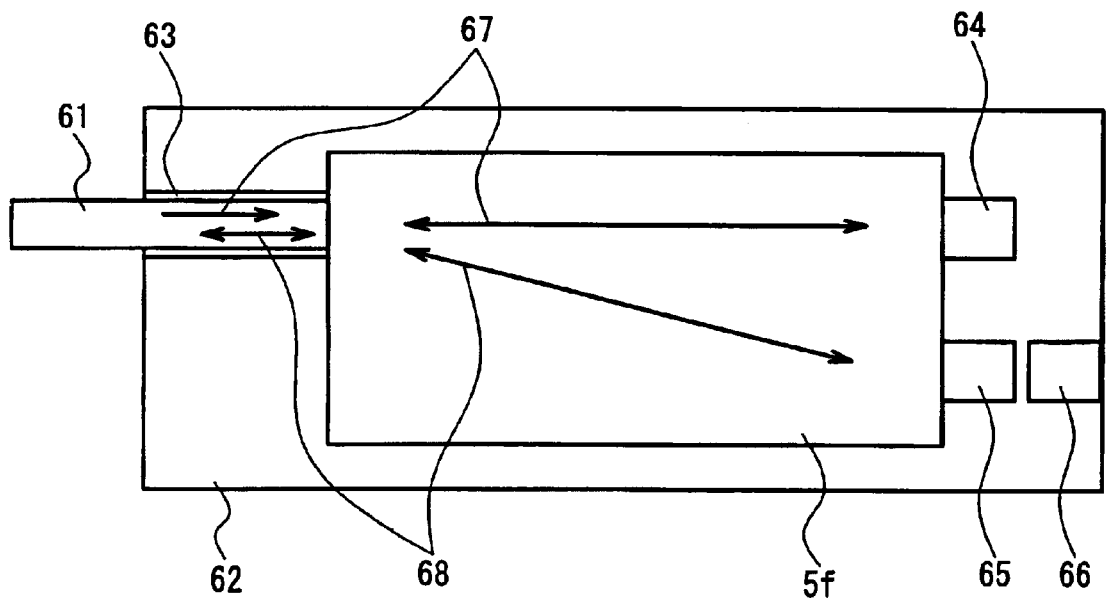
FIG. 10 is a plan view showing a configuration of a WDM transmitting/receiving module of Embodiment 6 according to the present invention.

An optical device of Embodiment 6 according to the present invention will be described with reference to FIG. 10. As shown in FIG. 10, an optical fiber 61 for transmitting two wavelengths (1.3 μm, 1.55 μm) of WDM fixed in a V-groove 63, a slab-shaped photonic crystal 5f, a photodiode (1.55 μm) 64, a laser diode (1.3 μm) 65, and a photodiode (1.3 μm) 66 are provided on a substrate 62 having the V-groove 63.

The photonic crystal 5f has a lattice structure similar to that of the photonic crystal 5e of Embodiment 5. That is, the photonic crystal 5f has a two-dimensional structure, in which columnar materials are disposed periodically in a first material. The central axes of the respective columnar materials are disposed parallel to each other. For example, the first material is made of $SiO_2$, acrylic resin (PMMA, UV acrylate resin, etc.), epoxy resin, polyimide resin, silicone resin, or carbonate resin such as polycarbonate, and the columnar materials are made of air. A lattice constant "a" (distance between the columnar materials) of the columnar materials preferably is 0.4 to 0.6 times the wavelength of light to be allowed to propagate. Aradius "r" of each columnar material preferably is 0.2 to 0.5 times the lattice constant "a". Furthermore, the photonic crystal 5f has an oblique lattice structure with low symmetry. A primitive lattice vector $a_1$ is parallel to the optical axis of the ingoing optical fiber 61, and an angle $\theta_1$ between the primitive lattice vectors ($a_1$, $a_2$) representing the arrangement of the columnar materials is larger than 60° and smaller than 90°. Furthermore, the crystal structure of the photonic crystal 5f is adjusted. When light is incident in the direction of the primitive lattice vector $a_1$ of the photonic crystal 5f, irrespective of an incident position of the light, only light with a wavelength of 1.3 μm is deflected largely, and light with a wavelength of 1.55 μm travels straight without being deflected.

Although not shown, a slab waveguide cladding with a refractive index lower than that of the first material is disposed on the upper surface of the photonic crystal 5f. The photodiode (1.55 μm) 64 is disposed so as to be opposed to the ingoing optical fiber 61 with respect to the photonic crystal 5f on the optical axis of the ingoing optical fiber 61. The laser diode (1.3 μm) 65 and the photodiode (1.3 μm) 66 are disposed at a position that is shifted from the optical axis of the ingoing optical fiber 61 and where deflected light is output, whereby light deflected in the photonic crystal 5f is disposed at a position away from the optical axis of the ingoing optical fiber 61 by a distance proportional to the lateral length of the photonic crystal 5f.

When signal light of 1.3/1.55 μm WDM is incident upon the photonic crystal 5f from the ingoing optical fiber 61, the light with a wavelength of 1.3 μm is deflected and received by the photodiode (1.3 μm) 66. The signal light emitted from the laser diode (1.3 μm) 65 is deflected in the photonic crystal 5f and sent to the ingoing optical fiber 61. The light with a wavelength of 1.55 μm travels straight to be received by the photodiode (1.55 μm) 64. An arrow 68 represents a propagation direction of light (1.3 μm), and an arrow 67 represents a propagation direction of light (1.55 μm).

In the above-mentioned manner, bidirectional communication can be conducted with light having a wavelength of 1.3 μm, and only receiving communication can be conducted with light having a wavelength of 1.55 μm, using the optical device of Embodiment 6.

As described above, in the optical device of Embodiment 6, a Y-shaped waveguide and a multi-layer filter for separation of wavelength are not required. Thus, a WDM transmitting/receiving module with fewer components can be realized with a simple configuration.

In Embodiments 5 and 6, the case has been described in which light having a wavelength of 1.55 μm travels straight, and light having a wavelength of 1.3 μm is deflected. However, by changing the lattice structure of a photonic crystal, light having a wavelength of 1.55 μm is refracted, and light having a wavelength of 1.3 μm travels straight.

Embodiment 7

An optical device of Embodiment 7 according to the present invention will be described with reference to FIG. 11.

Figure 11:
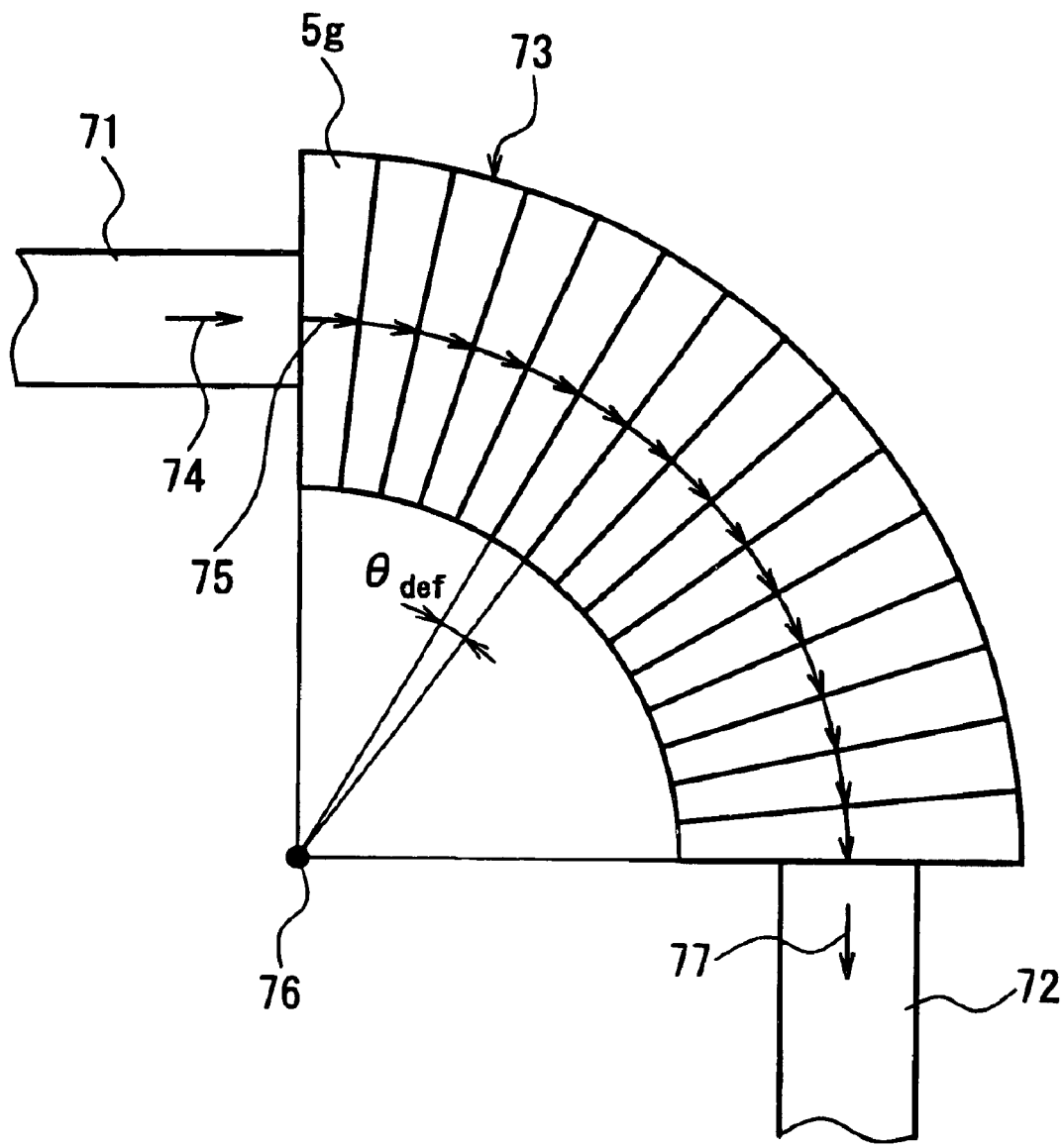
FIG. 11 is a plan view showing a configuration of an optical deflector of Embodiment 7 according to the present invention.

FIG. 11 shows a configuration of the optical device of Embodiment 7. The optical device of Embodiment 7 is composed of an ingoing optical waveguide core 71, an outgoing optical waveguide core 72 tilted by 90° with respect to the ingoing optical waveguide core 71, and a deflection circuit 73 to the ends of which the ingoing optical waveguide core 71 and the outgoing waveguide core 72 are coupled.

As shown in FIG. 11, the deflection circuit 73 is a part of a circle having a central point 76 as its center, and end faces thereof form an angle of 90°. The deflection circuit 73 has a configuration in which 15 photonic crystals 5g are connected to each other. Each photonic crystal 5g has a lattice structure similar to that of the photonic crystal 5 of Embodiment 1. That is, the photonic crystal 5g has a two-dimensional structure in which columnar materials are disposed periodically in a first material. The central axes of the respective columnar materials are parallel to each other. For example, the first material is made of $SiO_2$ or resin, and the columnar materials are made of air. It is preferable that a lattice constant "a" (distance between the columnar materials) of the columnar materials preferably is 0.4 to 0.6 times the wavelength of light to be allowed to propagate, and a radius "r" of the columnar materials is 0.2 to 0.5 times the lattice constant "a". Furthermore, the photonic crystal 5g has an oblique lattice structure with low symmetry. A primitive lattice vector $a_1$ is parallel to the optical axis of the ingoing optical waveguide core 71, and an angle $\theta_1$ between primitive lattice vectors ($a_1$, $a_2$) representing the arrangement of the columnar materials is larger than 60° and smaller than 90°. Furthermore, the crystal structure of the photonic crystal 5g is adjusted. When light is incident in the direction of the primitive lattice vector $a_1$ of the photonic crystal 5g, irrespective of an incident position of the light, the incident light is deflected by 6°.

Fifteen photonic crystals 5g are connected to each other in such a manner that the deflection circuit 73 is divided into 15 photonic crystals by $\theta_{def}=6°$ with respect to the central point 76, whereby the deflection circuit 73 is formed. There are 15 photonic crystals 5g each having $\theta_{def}=6°$ with respect to the central point 76. Therefore, the deflection angle of the deflection circuit 73 becomes 90° (6°×15).

Light incident upon the photonic crystal 5g in an incident direction 74 from the ingoing optical waveguide core 71 is deflected by 6° as represented by a traveling direction 75, and is incident upon the subsequent photonic crystal 5g. The incident light further is deflected by 6° and incident upon the subsequent photonic crystal 5g. The incident light repeats this and is incident upon the outgoing optical waveguide 72. That is, a traveling direction of light output from the deflection circuit 73 is an output direction 77, where the incident light is deflected by 90°.

As described above, by using the property that light is deflected in a photonic crystal, an optical device can be formed, which is capable of deflecting light at a desired angle.

Although not shown, the optical device is interposed between a substrate and a cladding. Furthermore, examples of a resin material for the first material include acrylic resin (PMMA, UV acrylate resin, etc.), epoxy resin, polyimide resin, silicone resin, carbonate resin such as polycarbonate, and the like.

It is preferable that the refractive index of the first material is 1.4 to 1.6, and the refractive index of the columnar materials is 0.9 to 1.1. It may also be possible that the difference in relative refractive index between the first material and the columnar materials is 1.0 or more. For example, a high refractive material such as Si, GaAs, and $Ti_2O_5$ may be used for the first material, and a low refractive material such as $SiO_2$ may be used for the columnar materials.

As described above, in the optical device of Embodiment 7, a light deflector can be formed easily.

In the optical devices of Embodiments 1 to 7, a photonic crystal having a two-dimensional structure with low symmetry is used. However, even if a photonic crystal having a three-dimensional structure with low symmetry is used, in the case where light is incident in the direction of the primitive lattice vector, strong deflection dispersion characteristics are exhibited. Therefore, even if a photonic crystal having a three-dimensional structure with low symmetry is used in the optical devices of Embodiments 1 to 7, the same effects as those of the above-mentioned optical device are obtained.

In the above description, the lattice structure in which the angle $\theta_1$ between the primitive lattice vectors ($a_1$, $a_2$) is larger than 60° and smaller than 90° has low symmetry. However, even in the case where a two-dimensional lattice structure composed of a group of primitive lattice vectors has a lattice structure having no rotation axis of more than 3-fold, the lattice structure has low symmetry. Therefore, the photonic crystal with such a lattice structure can be used for the above-mentioned optical device.

Embodiment 8

Figure 12A:
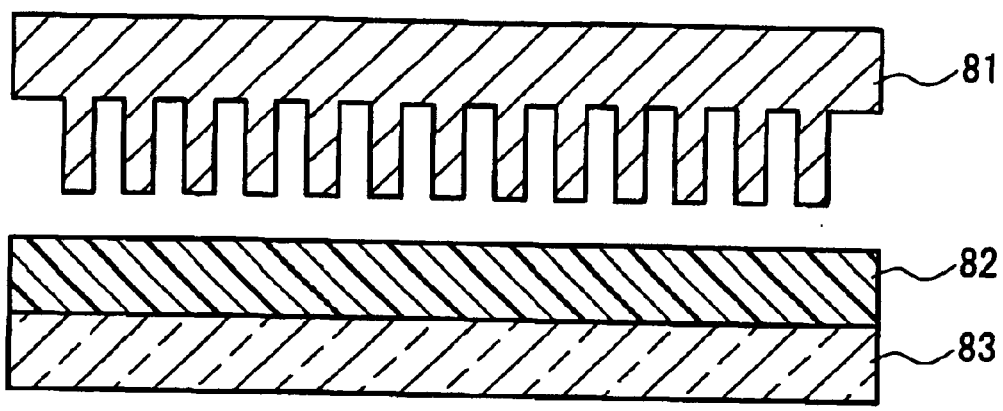
FIGS. 12A to 12C are side views showing the processes of producing a photonic crystal of Embodiment 8 according to the present invention (FIG. 12A is a first process, FIG. 12B is a second process, and FIG. 12C is a third process).
Figure 12B:
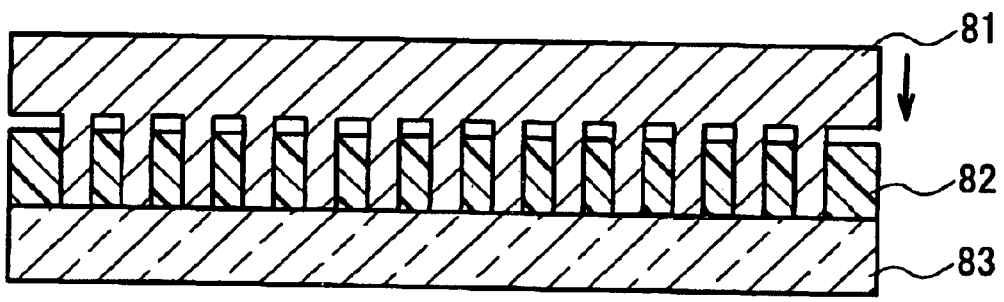
Figure 12C:
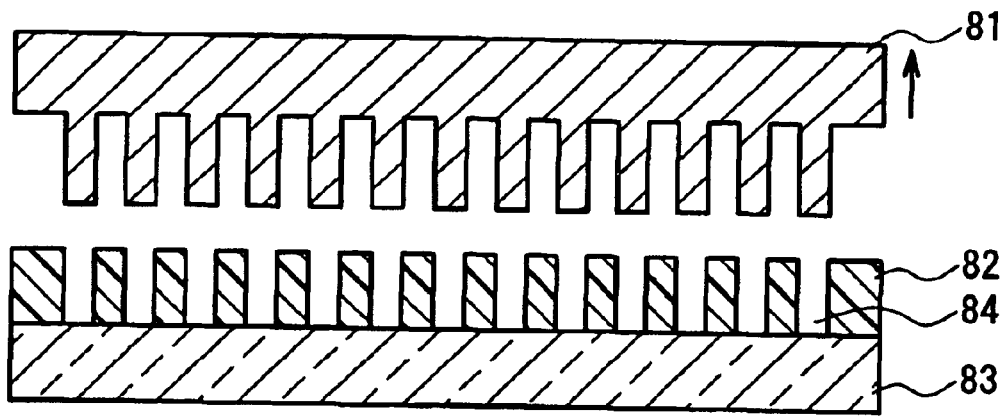

A method for producing a photonic crystal of an optical device of Embodiment 8 according to the present invention will be described with reference to FIGS. 12A to 12C. The photonic crystal in Embodiment 8 has a two-dimensional structure in which columnar materials are formed periodically in a first material 82. As shown in FIG. 12A, a thin film is vapor-deposited onto a substrate 83 by sputtering, whereby a first material 82 with a desired thickness is formed. As a method other than sputtering, resin is applied by spin-coating or resin dissolved in a solvent is subjected to casting, whereby the first material 82 with a desired thickness can be formed on the substrate 83. More specifically, a resin material with flowability is applied to the substrate 83 and dispersed to adjust the thickness, and the resin material is cured to form the first material 82 with a desired thickness.

A die 81 having projections at desired positions of the columnar materials to be disposed periodically is prepared. As shown in FIG. 12B, the die 81 is pressed onto the first material 82. Thus, holes 84 are formed at desired positions of the first material 82. If the holes 84 are left as they are, columnar materials of air are formed. However, another material having a refractive index different from that of the first material 82 may be added to the holes.

As described above, the optical device of Embodiment 8 contains a photonic crystal having a desired periodical structure, which can be formed easily.

The following also may be possible. Before the first material 82 is formed on the substrate 83, projections or the like are formed at positions where columnar materials are to be formed. Then, the first material 82 is formed while the thickness thereof is being adjusted by spin coating or casting. Thereafter, the projections are removed to form a photonic crystal.

Embodiment 9

Figure 13A:
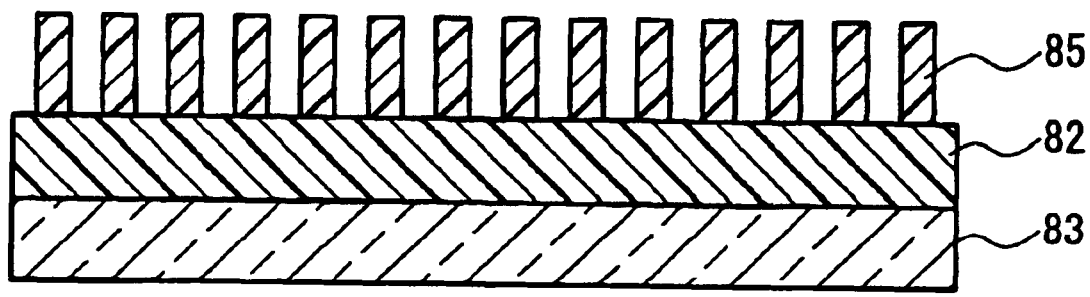
FIGS. 13A to 13C are side views showing the processes of producing a photonic crystal of Embodiment 9 according to the present invention (FIG. 13A is a first process, FIG. 13B is a second process, and FIG. 13C is a third process).
Figure 13B:
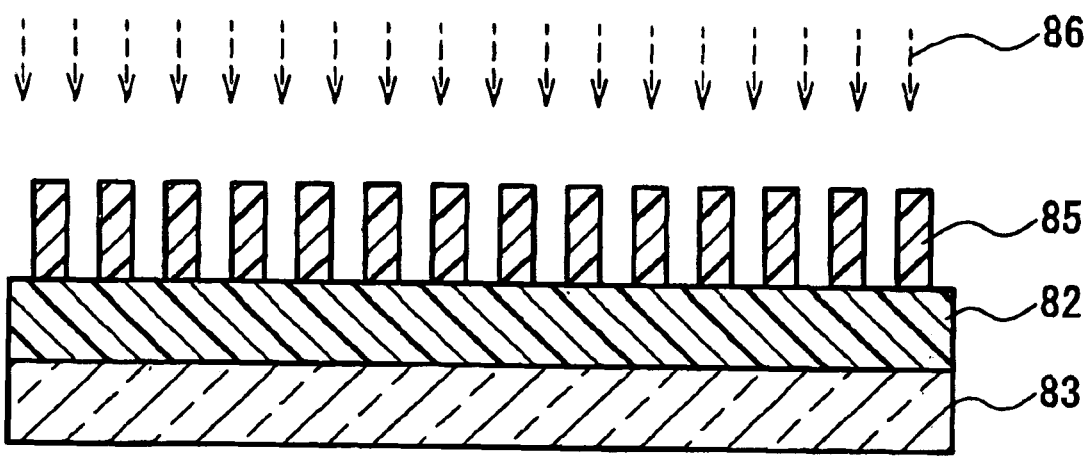
Figure 13C:
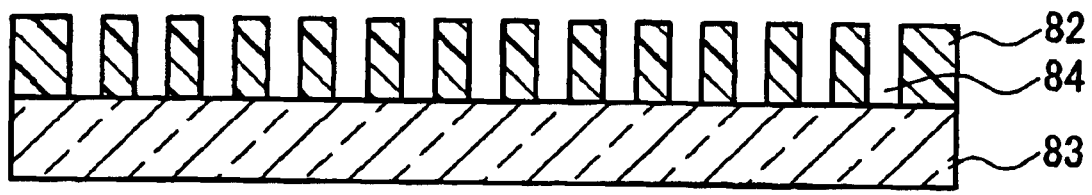

A method for producing a photonic crystal of an optical device of Embodiment 9 according to the present invention will be described with reference to FIGS. 13A to 13C. As shown in FIG. 13A, a thin film is vapor-deposited onto a substrate 83 by sputtering, resin is applied thereto by spin coating, or resin dissolved in a solvent is subjected to casting, whereby a first material 82 is formed on the substrate 83. Then, a mask 85 made of anodized aluminum is disposed on the first material 82 at desired positions of columnar materials to be disposed periodically. Then, as shown in FIG. 13B, the first material 82 is etched with an ion beam 86. In this manner, as shown in FIG. 13C, holes 84 are formed at desired positions of the first material 82. In the holes 84, columnar materials of air are formed. However, another material having a refractive index different from that of the first material 82 may be added to the holes 84.

As described above, the optical device of Embodiment 9 contains a photonic crystal having a desired periodic structure, which can be formed easily.

Embodiment 10

Figure 14A:
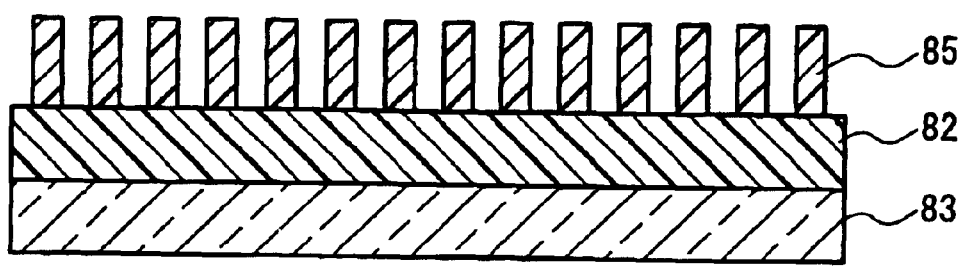
FIGS. 14A to 14C are side views showing the processes of producing a photonic crystal of Embodiment 10 according to the present invention (FIG. 14A is a first process, FIG. 14B is a second process, and FIG. 14C is a third process).
Figure 14B:
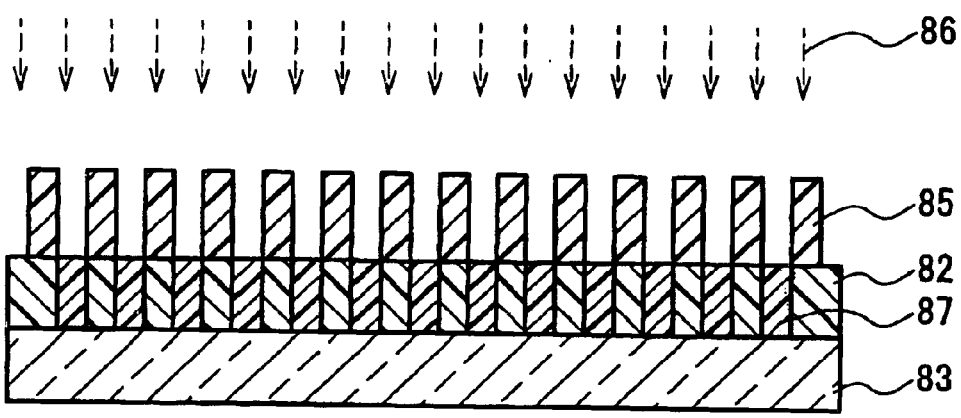
Figure 14C:
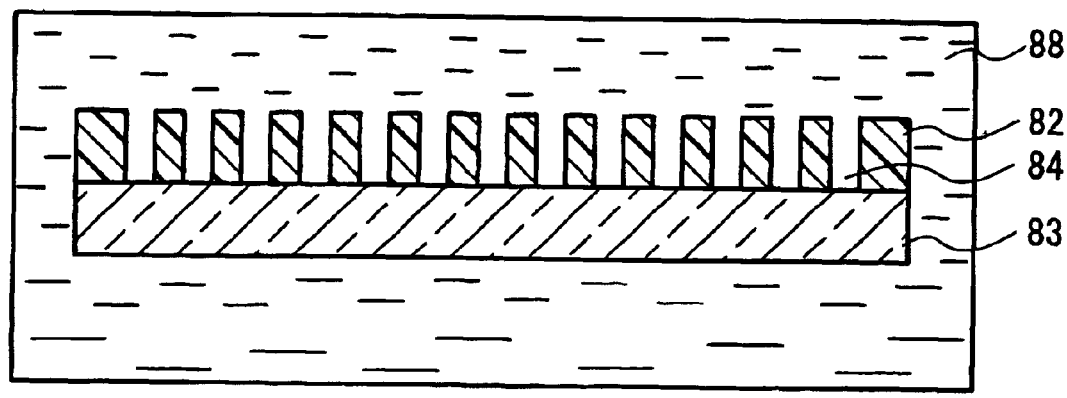

A method for producing a photonic crystal of an optical device of Embodiment 10 according to the present invention will be described with reference to FIGS. 14A to 14C. As shown in FIG. 14A, a thin film is vapor-deposited onto a substrate 83, resin is applied thereto by spin coating, or resin dissolved in a solvent is subjected to casting, whereby a first material 82 is formed on the substrate 83. Then, a mask 85 made of anodized aluminum is disposed on the first material 82 at desired positions of columnar materials to be disposed periodically. As shown in FIG. 14B, the first material 82 is irradiated with an ion beam 86 such as Ar ions. Due to the irradiation with the ion beam 86, tracks 87 are formed in portions of the first material 82 where the mask 85 is not disposed. In the tracks 87, molecular bonds of the first material 82 are cut. Next, as shown in FIG. 14C, the mask 85 is removed. Then, the first material 82 is soaked in a strong alkaline (e.g., NaOH) solution 88 together with the substrate 83. The first material 82 is not changed, whereas the tracks 82 in which molecular bonds are cut are corroded, whereby holes 84 are formed at desired positions of the first material 82. In the holes 84, columnar materials of air are formed. However, another material having a refractive index different from that of the first material 82 may be added to the holes 84.

As described above, the optical device of Embodiment 10 contains a photonic crystal having a desired periodic structure, which can be formed easily.

In the production of the photonic crystal in Embodiments 8 to 10, the first material 82 is formed on the substrate 83. However, it is not required to use the substrate 83. It also may be possible that the first material 82 is formed without using the substrate 83, and the holes 84 are formed at desired positions, whereby a photonic crystal is produced.

Embodiment 11

A method for producing a photonic crystal of an optical device of Embodiment 11 according to the present invention will be described with reference to FIGS. 15A and 15B.

Figure 15A:
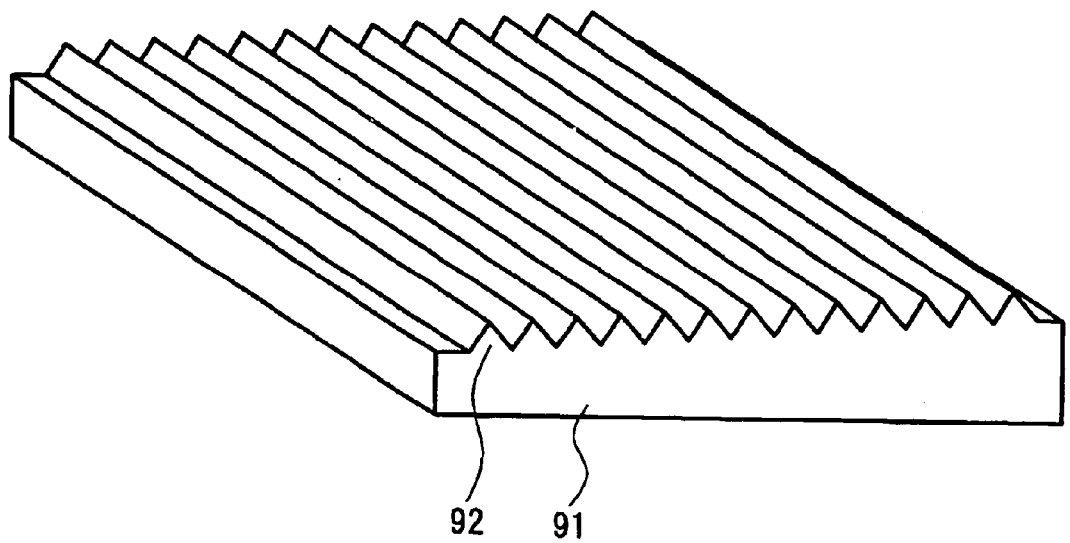
FIGS. 15A and 15B show a structure of a photonic crystal of Embodiment 11 according to the present invention (FIG.

A high refractive material 93 and a low refractive material 94 are stacked alternately on a substrate 91 having a periodic structure surface 92 shown in FIG. 15A, whereby a periodic stack structure is formed.

Figure 15B:
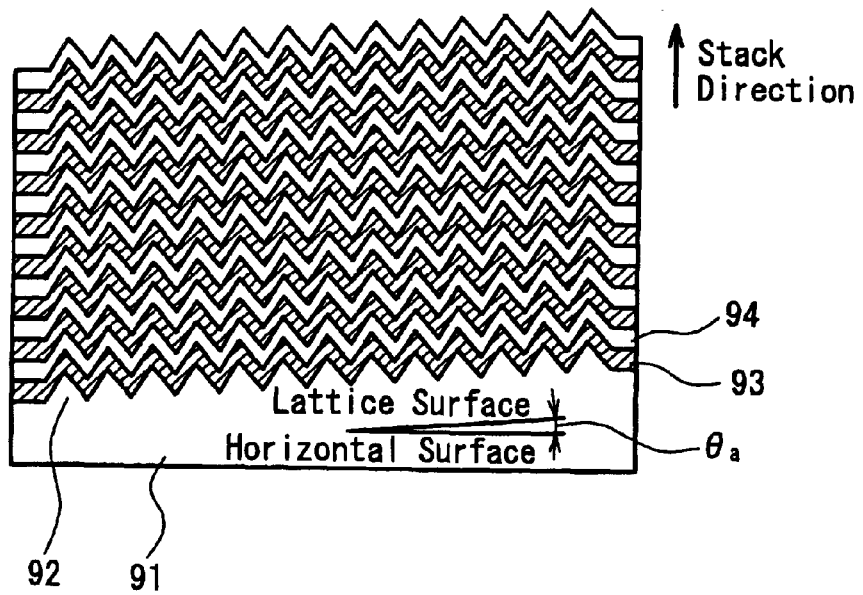

FIG. 15B shows a cross-sectional view of a photonic crystal. A lattice surface (stack surface) that is an upper surface of the substrate 91 is tilted by an angle $\theta_a$ from a horizontal surface vertical to a stack direction. The periodic structure surface 92 is provided with an uneven periodic pattern having a one-dimensional structure with a periodicity of 0.4 to 0.6 times the wavelength of a light source to be used, in parallel with the lattice surface. When the periodic stack structure is formed under the condition that the angle $\theta_a$ of the lattice surface of the substrate 91 is 5° to 25°, a photonic crystal is formed in which an angle equal to or smaller than 90° between two primitive lattice vectors is larger than 60° and smaller than 90°. Similarly, when a high refractive material and a low refractive material are stacked alternately on a substrate with a periodic pattern having a two-dimensional structure formed on the lattice surface to form a periodic stack structure, a three-dimensional periodic stack structure is formed, whereby a photonic crystal is obtained in which an angle equal to or smaller than 90° between two primitive lattice vectors is larger than 60° and smaller than 90°.

As described above, the optical device of Embodiment 11 contains a photonic crystal having a desired two-dimensional or three-dimensional periodic structure, which can be formed easily.

Embodiment 12

A method for producing a photonic crystal of an optical device of Embodiment 12 according to the present invention will be described with reference to FIGS. 16A and 16B.

Figure 16A:
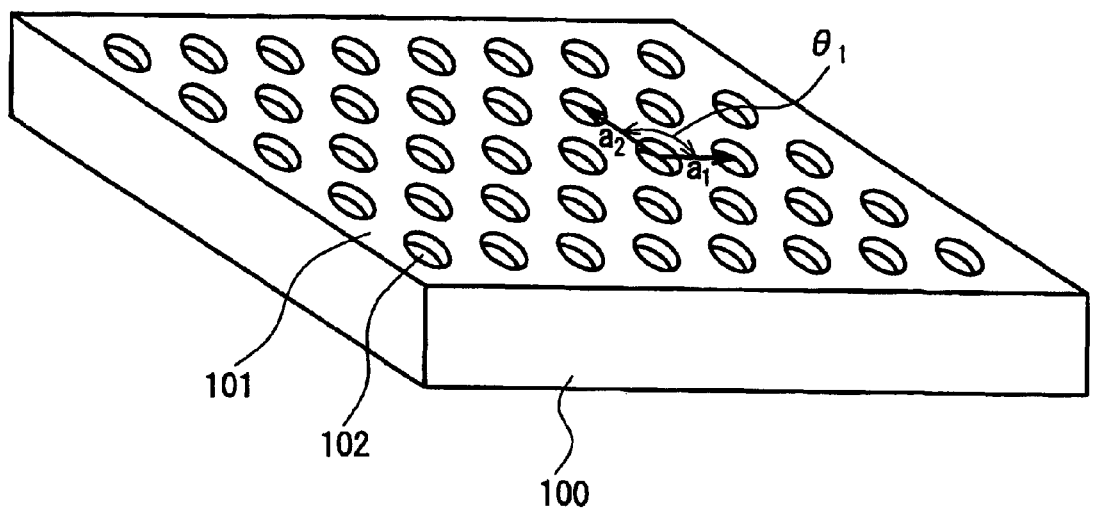
FIGS. 16A and 16B show a structure of a photonic crystal of Embodiment 12 according to the present invention (FIG. 16A is a perspective view of a substrate, and FIG. 16B is a side view thereof).
Figure 16B:
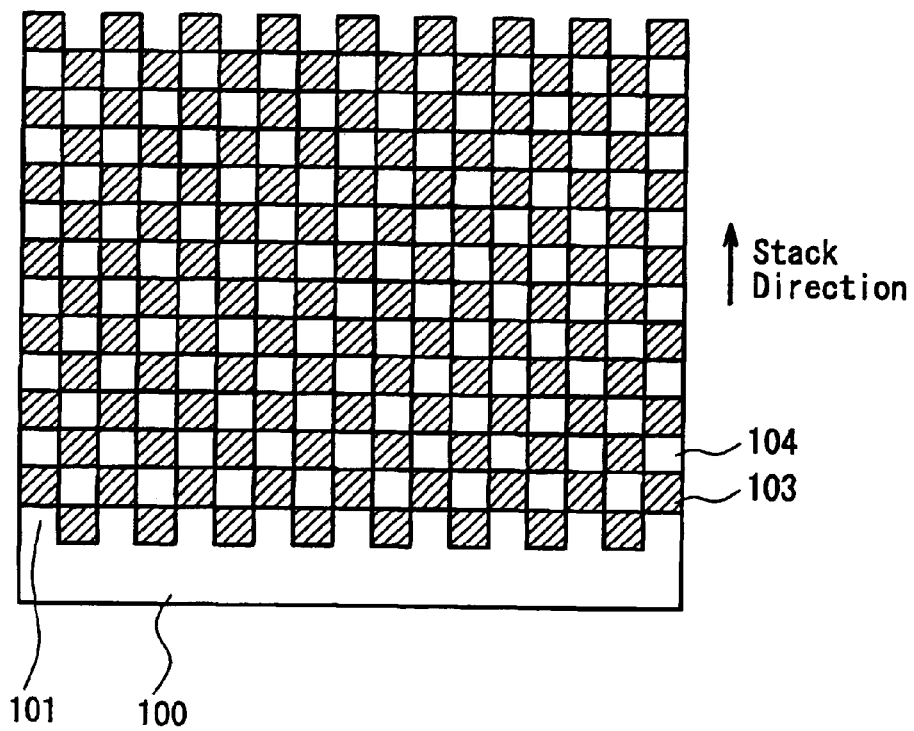
Figure 17:
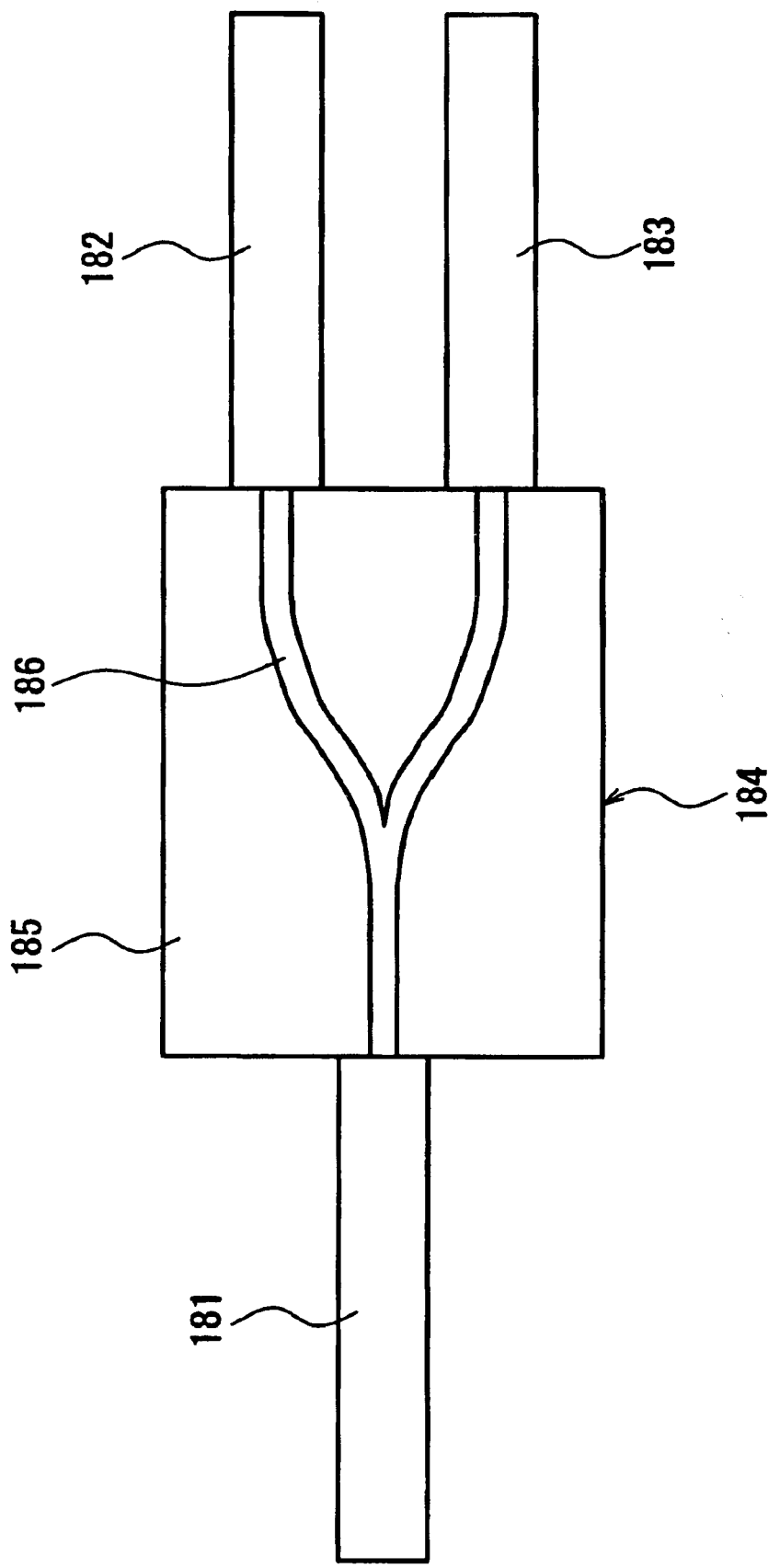
FIG. 17 is a plan view showing a configuration of a conventional optical separator.
Figure 18:
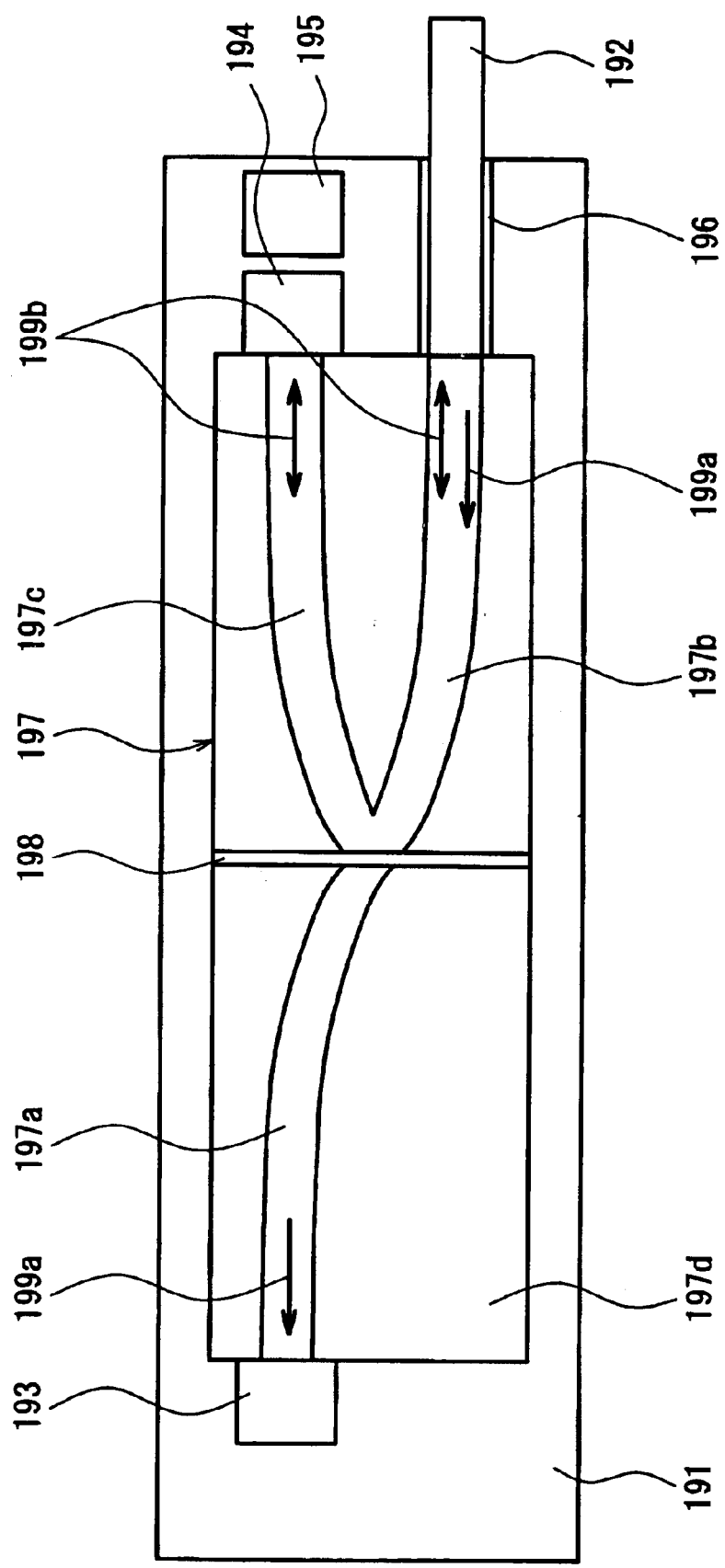
FIG. 18 is a plan view showing a configuration of a conventional WDM transmitting/receiving module.
Figure 19A:
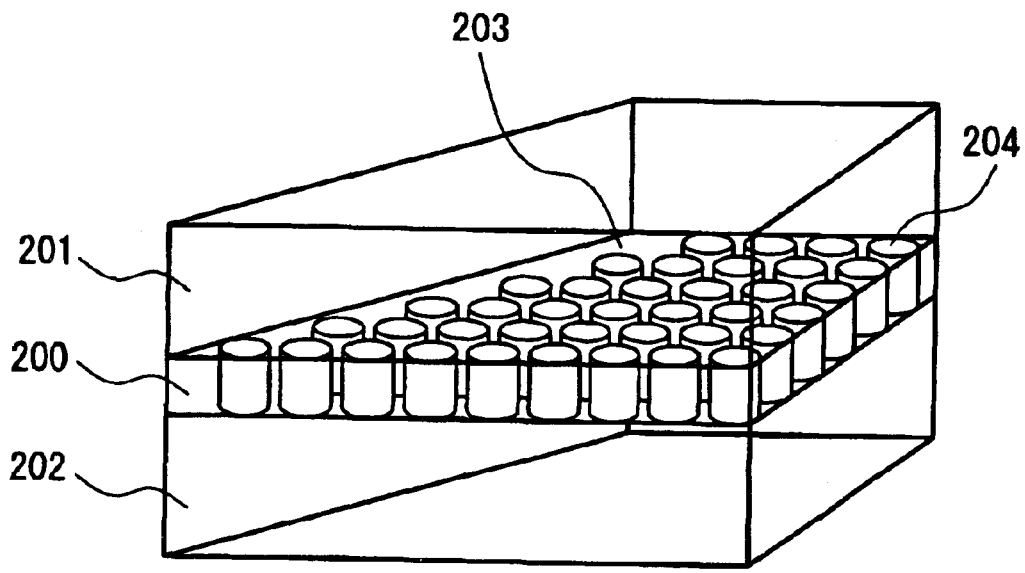
FIGS. 19A and 19B are a perspective view and a plan view showing a configuration of a conventional wavelength separating filter.
Figure 19B:
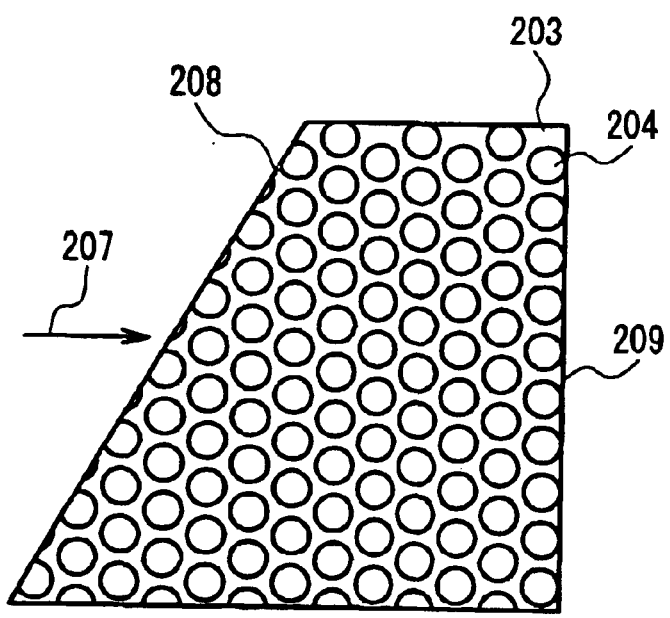
Figure 20C:
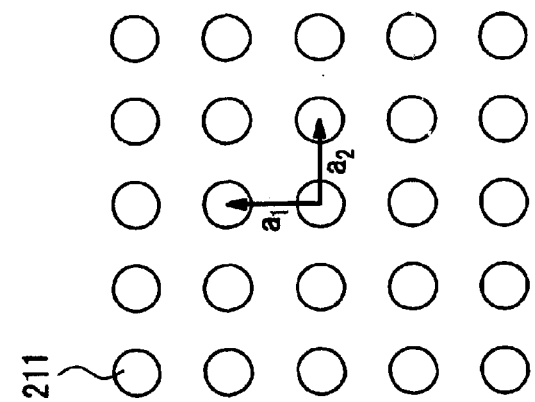
FIGS. 20A to 20C show relationships between lattices and Brillouin zones (FIG. 20A shows a tetragonal lattice, FIG. 20B shows a triangular lattice, and FIG. 20C shows an oblique lattice).
Figure 20C:
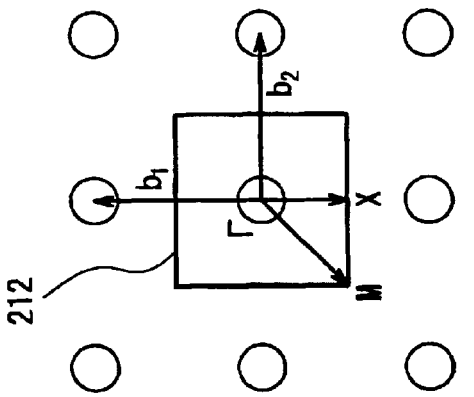
Figure 20B:
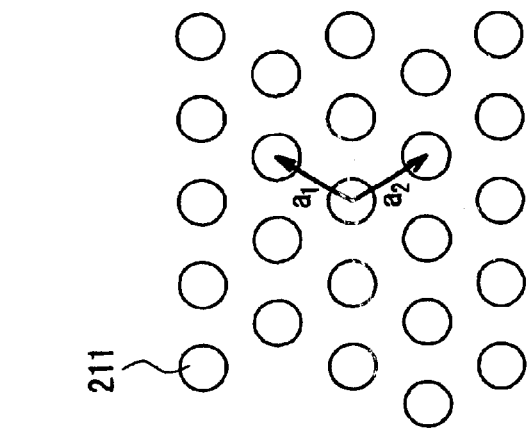
Figure 20B:
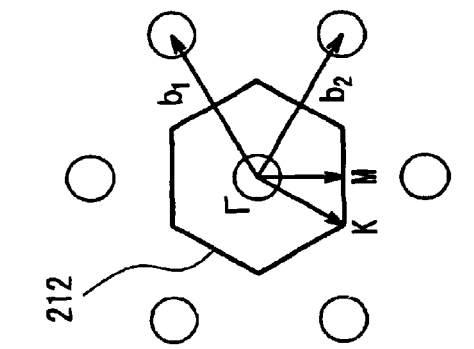
Figure 20A:
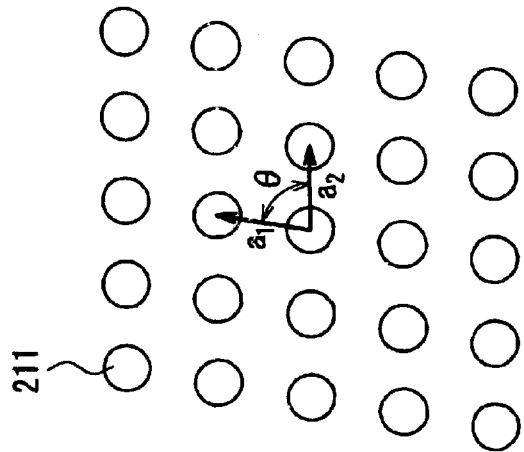
Figure 20A:
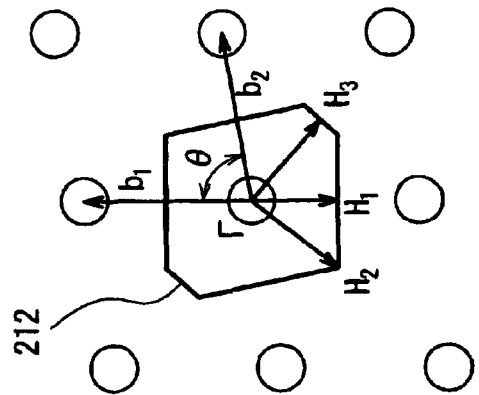

As shown in FIG. 16A, a periodic structure surface 101 is formed on the upper surface of a substrate 100, whereby a periodic pattern is formed using concave portions 102. The periodic pattern has a two-dimensional structure having a periodicity of 0.4 to 0.6 times the wavelength of a light source to be used, in which an lattice interior angle $\theta_1$ between two primitive lattice vectors ($a_1$, $a_2$) is larger than 60° and smaller than 90°. The high refractive material 103 is first stacked on the periodic structure surface 101. In the regions where the concave portions 102 are present, the high refractive material 103 is formed in the concave portions 102. In the regions where there are no concave portions 102, the high refractive material 103 is formed on the periodic structure surface 101. Therefore, the high refractive material 103 is formed in an uneven shape. Furthermore, the low refractive material 104 is formed thereon, so that the low refractive material 104 also is formed in an uneven shape. The high refractive material 103 and the low refractive material 104 are stacked alternately, whereby a three-dimensional periodic stack structure with a cross-section as shown in FIG. 16B is formed. It also may be possible to provide the upper surface of the substrate 100 with a slope.

As described above, the optical device of Embodiment 12 contains a photonic crystal having a desired three-dimensional structure, which can be formed easily.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An optical device comprising a photonic crystal having a two-dimensional or three-dimensional lattice structure in which a plurality of materials with different refractive indexes are arranged periodically, wherein a two-dimensional lattice structure composed of a group of primitive lattice vectors has a lattice structure having no rotation axis of more than 3-fold.

2. An optical device according to claim 1, comprising an incident portion for allowing light to be incident in a direction of a primitive lattice vector of the photonic crystal.

3. An optical device according to claim 2, wherein the photonic crystal has an incident surface vertical to the direction of the primitive lattice vector, and the incident portion is disposed so as to allow light to be incident vertically to the incident surface.

4. An optical device according to claim 1, wherein in the photonic crystal, an angle equal to or smaller than 90° between at least two different primitive lattice vectors among a plurality of primitive lattice vectors is larger than 60° and smaller than 90°.

5. An optical device comprising a photonic crystal comprising a first material and a plurality of columnar materials,
   wherein the plurality of columnar materials have a refractive index different from a refractive index of the first material and are disposed in the first material, and central axes of the plurality of columnar materials are parallel to each other, whereby a two-dimensional crystal lattice arrangement having a constant periodicity is formed, and a two-dimensional lattice structure composed of a group of primitive lattice vectors has a lattice structure having no rotation axis of more than 3-fold.

6. An optical device comprising a photonic crystal comprising a first material and a plurality of columnar materials,
   wherein the plurality of columnar materials have a refractive index different from a refractive index of the first material and are disposed in the first material, and central axes of the plurality of columnar materials are parallel to each other, whereby a two-dimensional crystal lattice arrangement having a constant periodicity is formed, and an angle equal to or smaller than 90° between two primitive lattice vectors is larger than 60° and smaller than 90°.

7. An optical device according to claim 6, wherein the photonic crystal is in a slab shape, the optical device further comprises a first cladding and a second cladding that have a refractive index lower than the refractive index of the first material of the photonic crystal, and the first cladding and the second cladding are disposed so as to be in contact with either side of the photonic crystal in the slab shape in a thickness direction.

8. An optical device according to claim 7, comprising an incident portion for allowing light to be incident in a direction of the primitive lattice vector of the photonic crystal.

9. An optical device according to claim 8, wherein the photonic crystal has an incident surface vertical to the direction of the primitive lattice vector, and the incident portion is disposed so as to allow light to be incident vertically to the incident surface.

10. An optical device according to claim 7, wherein a lattice constant of a two-dimensional lattice of the photonic crystal is 0.4 to 0.6 times a wavelength of a light source to be used.

11. An optical device according to claim 7, wherein each of the columnar materials has a cylindrical shape, and a radius thereof is 0.2 to 0.5 times a lattice constant.

12. An optical device according to claim 7, wherein a refractive index of the first material is 1.4 to 1.6, and a refractive index of the columnar materials is 0.9 to 1.1.

13. An optical device according to claim 7, wherein a difference between a refractive index of the first material and a refractive index of the columnar materials is at least 1.0.

14. An optical device according to claim 7, wherein the first material is made of a resin material, and the columnar materials are made of air.

15. An optical device according to claim 7, comprising an ingoing optical waveguide for allowing light to be incident in a direction of a primitive lattice vector of the photonic crystal, and a first outgoing optical waveguide and a second outgoing optical waveguide for receiving an output from the photonic crystal.

16. An optical device according to claim 7, comprising:
   an ingoing optical fiber for allowing light to be incident in a direction of a primitive lattice vector of the photonic crystal;
   a first outgoing optical fiber and a second outgoing optical fiber for receiving an output from the photonic crystal; and
   grooves for positioning the ingoing optical fiber, the first outgoing optical fiber, and the second outgoing optical fiber.

17. An optical device according to claim 16, wherein an optical axis of the first outgoing optical fiber substantially is matched with an optical axis of the ingoing optical fiber, and an optical axis of the second outgoing optical fiber is different from an optical axis of the ingoing optical fiber.

18. An optical device according to claim 16, wherein a distance between the optical axis of the second outgoing optical fiber and the optical axis of the ingoing optical fiber is proportional to a length in a direction of a primitive lattice vector of the photonic crystal.

19. An optical device according to claim 16, comprising a substrate having the grooves, wherein the substrate is integrated with the photonic crystal.

20. An optical device according to claim 16, wherein the grooves are provided in the first cladding or the second cladding.

21. An optical device according to claim 7, comprising:
   an optical fiber allowing light with a first wavelength and light with a second wavelength to propagate;
   a first light-receiving portion for receiving the light with the first wavelength;
   a light-emitting portion for emitting the light with the first wavelength;
   a second light-receiving portion for receiving the light with the second wavelength; and
   a substrate for fixing the optical fiber, the first light-receiving portion, the light-emitting portion, and the second light-receiving portion on a flat surface,
   wherein the optical fiber is disposed at one end of the photonic crystal, and an optical axis of the optical fiber is in parallel with a direction of a primitive lattice vector of the photonic crystal, the first light-receiving portion and the light-emitting portion are disposed in the same straight line as that of an optical axis of the optical fiber at the other end of the photonic crystal, and the second light-receiving portion is disposed at the other end of the photonic crystal.

22. An optical device according to claim 21, wherein a lattice constant of a two-dimensional lattice of the photonic crystal is 0.4 to 0.6 times the second wavelength.

23. An optical device according to claim 21, wherein each of the columnar materials has a cylindrical shape, and a radius thereof is 0.2 to 0.5 times a lattice constant.

24. An optical device according to claim 21, wherein a refractive index of the first material is 1.4 to 1.6, and a refractive index of the columnar materials is 0.9 to 1.1.

25. An optical device according to claim 21, wherein a difference between a refractive index of the first material and a refractive index of the columnar materials is at least 1.0.

26. An optical device according to claim 21, wherein the first material is made of a resin material, and the columnar materials are made of air.

27. An optical device according to claim 7, comprising:
an optical fiber allowing light with a first wavelength and light with a second wavelength to propagate;
a first light-receiving portion for receiving the light with the first wavelength;
a light-emitting portion for emitting the light with the second wavelength;
a second light-receiving portion for receiving the light with the second wavelength; and
a substrate for fixing the optical fiber, the first light-receiving portion, the light-emitting portion, and the second light-receiving portion on a flat surface,
wherein the optical fiber is disposed at one end of the photonic crystal, and an optical axis of the optical fiber is in parallel with a direction of a primitive lattice vector of the photonic crystal,
the first light-receiving portion is disposed in the same straight line as that of an optical axis of the optical fiber at the other end of the photonic crystal, and
the second light-receiving portion and the light-emitting portion are disposed at the other end of the photonic crystal.

28. An optical device according to claim 22, wherein a lattice constant of a two-dimensional lattice of the photonic crystal is 0.4 to 0.6 times the second wavelength.

29. An optical device according to claim 22, wherein each of the columnar materials has a cylindrical shape, and a radius thereof is 0.2 to 0.5 times a lattice constant.

30. An optical device according to claim 27, wherein a refractive index of the first material is 1.4 to 1.6, and a refractive index of the columnar materials is 0.9 to 1.1.

31. An optical device according to claim 27, wherein a difference between a refractive index of the first material and a refractive index of the columnar materials is at least 1.0.

32. An optical device according to claim 27, wherein the first material is made of a resin material, and the columnar materials are made of air.

33. An optical device comprising a composite photonic crystal in which two kinds of photonic crystals are bonded to each other so that respective primitive lattice vectors are aligned in the same direction, wherein each of the photonic crystals contains a first material and a plurality of columnar materials, the plurality of columnar materials have a refractive index different from a refractive index of the first material and are disposed in the first material, central axes of the plurality of columnar materials are parallel to each other, whereby a two-dimensional crystal lattice arrangement having a predetermined periodicity is formed, and an angle equal to or smaller than 90° between the two primitive lattice vectors is larger than 60° and smaller than 90°.

34. An optical device according to claim 33, wherein the composite photonic crystal is in a slab shape, the optical device further comprises a first cladding and a second cladding that have a refractive index lower than the refractive index of the first material of the two kinds of photonic crystals of the composite photonic crystal, and the first cladding and the second cladding are disposed so as to be in contact with either side of the composite photonic crystal in a thickness direction.

35. An optical device according to claim 34, wherein primitive lattice vectors that are not in the same direction among primitive lattice vectors of the two kinds of photonic crystals are axisymmetric with respect to a bonding surface between the two kinds of photonic crystals.

36. An optical device according to claim 35, wherein lattice constants of both two-dimensional lattices of the two kinds of photonic crystals are 0.4 to 0.6 times a wavelength of a light source to be used.

37. An optical device according to claim 35, wherein each of the columnar materials has a cylindrical shape, and a radius thereof is 0.2 to 0.5 times a lattice constant.

38. An optical device according to claim 35, wherein a refractive index of the first material is 1.4 to 1.6, and a refractive index of the columnar materials is 0.9 to 1.1.

39. An optical device according to claim 35, wherein a difference between a refractive index of the first material and a refractive index of the columnar materials is at least 1.0.

40. An optical device according to claim 35, wherein the first material is made of a resin material, and the columnar materials are made of air.

41. An optical device according to claim 35, comprising:
an ingoing optical waveguide for allowing light to be incident upon a bonding portion of the composite photonic crystal in a direction of a primitive lattice vector of the two kinds of photonic crystals;
a first outgoing optical waveguide for receiving an output from one photonic crystal of the composite photonic crystal; and
a second outgoing optical waveguide for receiving an output from the other photonic crystal of the composite photonic crystal,
wherein the ingoing optical waveguide is disposed at one end of the composite photonic crystal, and
the first outgoing optical waveguide and the second outgoing optical waveguide are disposed at the other end of the composite photonic crystal.

42. An optical device according to claim 35, comprising:
an ingoing optical fiber for allowing light to be incident upon a bonding portion of the composite photonic crystal in a direction of a primitive lattice vector of the two kinds of photonic crystals;
a first outgoing optical fiber for receiving an output from one photonic crystal of the composite photonic crystal;
a second outgoing optical fiber for receiving an output from the other photonic crystal of the composite photonic crystal; and
grooves for positioning the ingoing optical fiber, the first outgoing optical fiber, and the second outgoing optical fiber, wherein the ingoing optical fiber is disposed at one end of the composite photonic crystal, and the first outgoing optical fiber and the second outgoing optical fiber are disposed at the other end of the composite photonic crystal.

43. An optical device according to claim 42, comprising a substrate having the grooves, wherein the substrate is integrated with the composite photonic crystal.

44. An optical device according to claim 42, wherein the grooves are provided in the first cladding or the second cladding.

45. An optical device according to claim 34, wherein parallel composite photonic crystals including a plurality of the composite photonic crystals in parallel with each other are disposed in tandem in multiple stages.

46. An optical device comprising:

a plurality of photonic crystals each containing a first material and a plurality of columnar materials, in which the plurality of columnar materials have a refractive index different from a refractive index of the first material and are disposed in the first material, central axes of the plurality of columnar materials are parallel to each other, whereby a two-dimensional crystal lattice arrangement having a predetermined periodicity is formed, and an angle equal to or smaller than 90° between the two primitive lattice vectors is larger than 60° and smaller than 90°;

an ingoing optical waveguide and an outgoing optical waveguide; and a substrate on which the plurality of photonic crystals, the ingoing optical waveguide, and the outgoing optical waveguide are disposed, wherein the plurality of photonic crystals are bonded in tandem in a direction of a primitive vector, each of the photonic crystals is disposed so that output light deflected by an adjacent photonic crystal is in the direction of the primitive lattice vector, and the ingoing optical waveguide and the outgoing optical waveguide are bonded to each of the photonic crystals positioned at both ends.

47. An optical device according to claim 46, wherein a lattice constant of a two-dimensional lattice of the plurality of photonic crystals is 0.4 to 0.6 times a wavelength of a light source to be used.

48. An optical device according to claim 46, wherein each of the columnar materials has a cylindrical shape, and a radius thereof is 0.2 to 0.5 times a lattice constant.

49. An optical device according to claim 46, wherein a refractive index of the first material is 1.4 to 1.6, and a refractive index of the columnar materials is 0.9 to 1.1.

50. An optical device according to claim 46, wherein a difference between a refractive index of the first material and a refractive index of the columnar materials is at least 1.0.

51. An optical device according to claim 46, wherein the first material is made of a resin material, and the columnar materials are made of air.

52. An optical device according to claim 46, wherein a size, a shape, and a position of the plurality of photonic crystals are determined so that a propagation distance of light in each of the plurality of photonic crystals becomes equal to each other.

53. An optical device according to claim 46, wherein an angle formed by incident light from the ingoing optical waveguide and output light from the outgoing optical waveguide is equal to a sum of angles at which light is deflected in the plurality of photonic crystals.

54. An optical device comprising a photonic crystal obtained by pressing a slab-shaped first material formed on a substrate with a die having columnar projections whose central axes are parallel to each other and which have a constant periodicity, in a thickness direction of the first material, and removing the die from the slab-shaped material to open columnar holes in the first material.

55. An optical device according to claim 54, wherein the first material is formed by coating the substrate with a material having flowability, uniformly dispersing the material to adjust a thickness thereof, and curing the material.

56. An optical device according to claim 54, wherein the columnar holes provided in the first material are filled with another material having a refractive index different from that of the first material.

57. An optical device comprising a photonic crystal obtained by forming a mask with a predetermined periodicity on a slab-shaped first material formed on a substrate, and etching an exposed portion of the mask to open columnar holes in the first material.

58. An optical device according to claim 57, wherein the first material is formed by coating the substrate with a material having flowability, uniformly dispersing the material to adjust a thickness thereof, and curing the material.

59. An optical device according to claim 57, wherein the columnar holes provided in the first material are filled with another material having a refractive index different from that of the first material.

60. An optical device comprising a photonic crystal obtained by forming a mask with a predetermined periodicity on a slab-shaped first material formed on a substrate, irradiating the first material with an ion beam to form track portions in exposed portions of the mask, and corroding the track portions by soaking the first material in an alkali solution, thereby opening columnar holes in the first material.

61. An optical device according to claim 60, wherein the first material is formed by coating the substrate with a material having flowability, uniformly dispersing the material to adjust a thickness thereof, and curing the material.

62. An optical device according to claim 60, wherein the columnar holes provided in the first material are filled with another material having a refractive index different from that of the first material.

63. An optical device comprising a photonic crystal obtained by forming convex portions with a predetermined periodicity on a substrate, coating regions between the convex portions with a material having flowability, dispersing the material on the substrate to adjust a thickness of the material, curing the material, removing the convex portions to open columnar holes, and filling the columnar holes with another material having a refractive index different from that of the material having flowability.

64. An optical device having a horizontal surface vertical to a stack direction, comprising a substrate in which a predetermined periodic pattern is formed in a one-dimensional or two-dimensional structure in a horizontal direction on a stack surface tilted from the horizontal surface, and a photonic crystal having a two-dimensional periodic stack structure in which at least two kinds of materials with different refractive indexes are stacked alternately on the substrate.

65. An optical device according to claim 64, wherein a periodicity of the predetermined periodic pattern is 0.4 to 0.6 times a wavelength of a light source to be used.

66. An optical device according to claim 64, wherein a tilt of the stack surface with respect to the horizontal surface is 5° to 25°.

67. An optical device comprising a substrate on which a predetermined periodic pattern is formed in a one-dimensional or two-dimensional structure so that an angle equal to or smaller than 90° between two primitive lattice vectors of a two-dimensional lattice is larger than 60° and smaller than 90°, and a photonic crystal having a two-dimensional or three-dimensional periodic stack structure in which at least two kinds of materials having different refractive indexes are stacked alternately on the substrate.

68. An optical device according to claim 67, wherein a periodicity of the predetermined periodic pattern is 0.4 to 0.6 times a wavelength of a light source to be used.

* * * * *